(12) United States Patent
Choi et al.

(10) Patent No.: US 9,659,670 B2
(45) Date of Patent: May 23, 2017

(54) COMPUTER-IMPLEMENTED METHODS, COMPUTER-READABLE MEDIA, AND SYSTEMS FOR CLASSIFYING DEFECTS DETECTED IN A MEMORY DEVICE AREA ON A WAFER

(75) Inventors: SunYong Choi, Kyunggi-Do (KR); YeonHo Pae, Kyunggi-Do (KR); Ellis Chang, Saratoga, CA (US)

(73) Assignee: KLA-Tencor Corp., Milpitas, CA (US)

( * ) Notice: Subject to any disclaimer, the term of this patent is extended or adjusted under 35 U.S.C. 154(b) by 797 days.

(21) Appl. No.: 13/056,623

(22) PCT Filed: Jul. 28, 2009

(86) PCT No.: PCT/US2009/051961
§ 371 (c)(1),
(2), (4) Date: Mar. 13, 2011

(87) PCT Pub. No.: WO2010/014609
PCT Pub. Date: Feb. 4, 2010

(65) Prior Publication Data
US 2011/0187848 A1    Aug. 4, 2011

Related U.S. Application Data

(60) Provisional application No. 61/137,274, filed on Jul. 28, 2008.

(51) Int. Cl.
*H04N 19/00*    (2014.01)
*G11C 29/56*    (2006.01)

(52) U.S. Cl.
CPC ........ *G11C 29/56* (2013.01); *G11C 29/56008* (2013.01)

(58) Field of Classification Search
CPC ............................ G06F 17/50; H04N 1/00002
USPC ........................................................... 348/92
See application file for complete search history.

(56) References Cited

U.S. PATENT DOCUMENTS

| | | |
|---|---|---|
| 3,495,269 A | 2/1970 | Mutschler et al. |
| 3,496,352 A | 2/1970 | Jugle |
| 3,909,602 A | 9/1975 | Micka |
| 4,015,203 A | 3/1977 | Verkuil |
| 4,247,203 A | 1/1981 | Levy et al. |
| 4,347,001 A | 8/1982 | Levy et al. |
| 4,378,159 A | 3/1983 | Galbraith |
| 4,448,532 A | 5/1984 | Joseph et al. |
| 4,475,122 A | 10/1984 | Green |

(Continued)

FOREIGN PATENT DOCUMENTS

| | | |
|---|---|---|
| CN | 1339140 | 3/2002 |
| CN | 1398348 | 2/2003 |

(Continued)

OTHER PUBLICATIONS

Garcia et al., "New Die to Database Inspection Algorithm for Inspection of 90-nm Node Reticles," Proceedings of SPIE, vol. 5130, 2003, pp. 364-374.

(Continued)

*Primary Examiner* — Frank Huang
(74) *Attorney, Agent, or Firm* — Ann Marie Mewherter

(57) ABSTRACT

Computer-implemented methods, computer-readable media, and systems for classifying defects detected in a memory device area on a wafer are provided.

60 Claims, 5 Drawing Sheets

(56) References Cited

U.S. PATENT DOCUMENTS

| | | |
|---|---|---|
| 4,532,650 A | 7/1985 | Wihl et al. |
| 4,555,798 A | 11/1985 | Broadbent, Jr. et al. |
| 4,578,810 A | 3/1986 | MacFarlane et al. |
| 4,579,455 A | 4/1986 | Levy et al. |
| 4,595,289 A | 6/1986 | Feldman et al. |
| 4,599,558 A | 7/1986 | Castellano, Jr. et al. |
| 4,633,504 A | 12/1986 | Wihl |
| 4,641,353 A | 2/1987 | Kobayashi |
| 4,641,967 A | 2/1987 | Pecen |
| 4,734,721 A | 3/1988 | Boyer et al. |
| 4,748,327 A | 5/1988 | Shinozaki et al. |
| 4,758,094 A | 7/1988 | Wihl et al. |
| 4,766,324 A | 8/1988 | Saadat et al. |
| 4,799,175 A | 1/1989 | Sano et al. |
| 4,805,123 A | 2/1989 | Specht et al. |
| 4,812,756 A | 3/1989 | Curtis et al. |
| 4,814,829 A | 3/1989 | Kosugi et al. |
| 4,817,123 A | 3/1989 | Sones et al. |
| 4,845,558 A | 7/1989 | Tsai et al. |
| 4,877,326 A | 10/1989 | Chadwick et al. |
| 4,926,489 A | 5/1990 | Danielson et al. |
| 4,928,313 A | 5/1990 | Leonard et al. |
| 5,046,109 A | 9/1991 | Fujimori et al. |
| 5,124,927 A | 6/1992 | Hopewell et al. |
| 5,189,481 A | 2/1993 | Jann et al. |
| 5,355,212 A | 10/1994 | Wells et al. |
| 5,444,480 A | 8/1995 | Sumita |
| 5,453,844 A | 9/1995 | George et al. |
| 5,481,624 A | 1/1996 | Kamon |
| 5,485,091 A | 1/1996 | Verkuil |
| 5,497,381 A | 3/1996 | O'Donoghue et al. |
| 5,528,153 A | 6/1996 | Taylor et al. |
| 5,544,256 A | 8/1996 | Brecher et al. |
| 5,563,702 A | 10/1996 | Emery et al. |
| 5,572,598 A | 11/1996 | Wihl et al. |
| 5,578,821 A | 11/1996 | Meisberger et al. |
| 5,594,247 A | 1/1997 | Verkuil et al. |
| 5,608,538 A | 3/1997 | Edgar et al. |
| 5,619,548 A | 4/1997 | Koppel |
| 5,621,519 A | 4/1997 | Frost et al. |
| 5,644,223 A | 7/1997 | Verkuil |
| 5,650,731 A | 7/1997 | Fung et al. |
| 5,661,408 A | 8/1997 | Kamieniecki et al. |
| 5,689,614 A | 11/1997 | Gronet et al. |
| 5,694,478 A | 12/1997 | Braier et al. |
| 5,696,835 A | 12/1997 | Hennessey et al. |
| 5,703,969 A | 12/1997 | Hennessey et al. |
| 5,716,889 A * | 2/1998 | Tsuji et al. .................. 438/401 |
| 5,737,072 A | 4/1998 | Emery et al. |
| 5,742,658 A | 4/1998 | Tiffin et al. |
| 5,754,678 A | 5/1998 | Hawthorne et al. |
| 5,767,691 A | 6/1998 | Verkuil |
| 5,767,693 A | 6/1998 | Verkuil |
| 5,771,317 A | 6/1998 | Edgar |
| 5,773,989 A | 6/1998 | Edelman et al. |
| 5,774,179 A | 6/1998 | Chevrette et al. |
| 5,795,685 A | 8/1998 | Liebmann et al. |
| 5,822,218 A | 10/1998 | Moosa et al. |
| 5,831,865 A | 11/1998 | Berezin et al. |
| 5,834,941 A | 11/1998 | Verkuil |
| 5,852,232 A | 12/1998 | Samsavar et al. |
| 5,866,806 A | 2/1999 | Samsavar et al. |
| 5,874,733 A | 2/1999 | Silver et al. |
| 5,884,242 A | 3/1999 | Meier et al. |
| 5,889,593 A | 3/1999 | Bareket |
| 5,917,332 A | 6/1999 | Chen et al. |
| 5,932,377 A | 8/1999 | Ferguson et al. |
| 5,940,458 A | 8/1999 | Suk |
| 5,948,972 A | 9/1999 | Samsavar et al. |
| 5,955,661 A | 9/1999 | Samsavar et al. |
| 5,965,306 A | 10/1999 | Mansfield et al. |
| 5,978,501 A | 11/1999 | Badger et al. |
| 5,980,187 A | 11/1999 | Verhovsky |
| 5,986,263 A | 11/1999 | Hiroi et al. |
| 5,991,699 A | 11/1999 | Kulkarni et al. |
| 5,999,003 A | 12/1999 | Steffan et al. |
| 6,011,404 A | 1/2000 | Ma et al. |
| 6,014,461 A | 1/2000 | Hennessey et al. |
| 6,040,911 A | 3/2000 | Nozaki et al. |
| 6,040,912 A | 3/2000 | Zika et al. |
| 6,052,478 A | 4/2000 | Wihl et al. |
| 6,060,709 A | 5/2000 | Verkuil et al. |
| 6,072,320 A | 6/2000 | Verkuil |
| 6,076,465 A | 6/2000 | Vacca et al. |
| 6,078,738 A | 6/2000 | Garza et al. |
| 6,091,257 A | 7/2000 | Verkuil et al. |
| 6,091,846 A | 7/2000 | Lin et al. |
| 6,097,196 A | 8/2000 | Verkuil et al. |
| 6,097,887 A | 8/2000 | Hardikar et al. |
| 6,104,206 A | 8/2000 | Verkuil |
| 6,104,835 A | 8/2000 | Han |
| 6,117,598 A | 9/2000 | Imai |
| 6,121,783 A | 9/2000 | Horner et al. |
| 6,122,017 A | 9/2000 | Taubman |
| 6,122,046 A | 9/2000 | Almogy |
| 6,137,570 A | 10/2000 | Chuang et al. |
| 6,141,038 A | 10/2000 | Young et al. |
| 6,146,627 A | 11/2000 | Muller et al. |
| 6,171,737 B1 | 1/2001 | Phan et al. |
| 6,175,645 B1 | 1/2001 | Elyasaf et al. |
| 6,184,929 B1 | 2/2001 | Noda et al. |
| 6,184,976 B1 | 2/2001 | Park et al. |
| 6,191,605 B1 | 2/2001 | Miller et al. |
| 6,201,999 B1 | 3/2001 | Jevtic |
| 6,202,029 B1 | 3/2001 | Verkuil et al. |
| 6,205,239 B1 | 3/2001 | Lin et al. |
| 6,215,551 B1 | 4/2001 | Nikoonahad et al. |
| 6,224,638 B1 | 5/2001 | Jevtic et al. |
| 6,233,719 B1 | 5/2001 | Hardikar et al. |
| 6,246,787 B1 | 6/2001 | Hennessey et al. |
| 6,248,485 B1 | 6/2001 | Cuthbert |
| 6,248,486 B1 | 6/2001 | Dirksen et al. |
| 6,259,960 B1 | 7/2001 | Inokuchi |
| 6,266,437 B1 | 7/2001 | Eichel et al. |
| 6,267,005 B1 | 7/2001 | Samsavar et al. |
| 6,268,093 B1 | 7/2001 | Kenan et al. |
| 6,272,236 B1 | 8/2001 | Pierrat et al. |
| 6,282,309 B1 | 8/2001 | Emery |
| 6,292,582 B1 | 9/2001 | Lin et al. |
| 6,295,374 B1 | 9/2001 | Robinson et al. |
| 6,324,298 B1 | 11/2001 | O'Dell et al. |
| 6,336,082 B1 | 1/2002 | Nguyen et al. |
| 6,344,640 B1 | 2/2002 | Rhoads |
| 6,363,166 B1 | 3/2002 | Wihl et al. |
| 6,366,687 B1 | 4/2002 | Aloni et al. |
| 6,373,975 B1 | 4/2002 | Bula et al. |
| 6,388,747 B2 | 5/2002 | Nara et al. |
| 6,393,602 B1 | 5/2002 | Atchison et al. |
| 6,407,373 B1 | 6/2002 | Dotan |
| 6,415,421 B2 | 7/2002 | Anderson et al. |
| 6,427,024 B1 | 7/2002 | Bishop |
| 6,445,199 B1 | 9/2002 | Satya et al. |
| 6,451,690 B1 | 9/2002 | Matsumoto et al. |
| 6,459,520 B1 | 10/2002 | Takayama |
| 6,466,314 B1 | 10/2002 | Lehman |
| 6,466,315 B1 | 10/2002 | Karpol et al. |
| 6,470,489 B1 | 10/2002 | Chang et al. |
| 6,483,938 B1 | 11/2002 | Hennessey et al. |
| 6,513,151 B1 | 1/2003 | Erhardt et al. |
| 6,526,164 B1 | 2/2003 | Mansfield et al. |
| 6,529,621 B1 | 3/2003 | Glasser et al. |
| 6,535,628 B2 | 3/2003 | Smargiassi et al. |
| 6,539,106 B1 | 3/2003 | Gallarda et al. |
| 6,553,329 B2 | 4/2003 | Balachandran |
| 6,569,691 B1 | 5/2003 | Jastrzebski et al. |
| 6,581,193 B1 | 6/2003 | McGhee et al. |
| 6,593,748 B1 | 7/2003 | Halliyal et al. |
| 6,597,193 B2 | 7/2003 | Lagowski et al. |
| 6,602,728 B1 | 8/2003 | Liebmann et al. |
| 6,608,681 B2 | 8/2003 | Tanaka et al. |
| 6,614,520 B1 | 9/2003 | Bareket et al. |
| 6,631,511 B2 | 10/2003 | Haffner et al. |
| 6,636,301 B1 | 10/2003 | Kvamme et al. |
| 6,642,066 B1 | 11/2003 | Halliyal et al. |

(56) References Cited

U.S. PATENT DOCUMENTS

| | | |
|---|---|---|
| 6,658,640 B2 | 12/2003 | Weed |
| 6,665,065 B1 | 12/2003 | Phan et al. |
| 6,670,082 B2 | 12/2003 | Liu et al. |
| 6,680,621 B2 | 1/2004 | Savtchouk |
| 6,691,052 B1 | 2/2004 | Maurer |
| 6,701,004 B1 | 3/2004 | Shykind et al. |
| 6,718,526 B1 | 4/2004 | Eldredge et al. |
| 6,721,695 B1 | 4/2004 | Chen et al. |
| 6,734,696 B2 | 5/2004 | Horner et al. |
| 6,738,954 B1 | 5/2004 | Allen et al. |
| 6,748,103 B2 | 6/2004 | Glasser et al. |
| 6,751,519 B1 | 6/2004 | Satya et al. |
| 6,753,954 B2 | 6/2004 | Chen |
| 6,757,645 B2 | 6/2004 | Chang et al. |
| 6,759,655 B2 | 7/2004 | Nara et al. |
| 6,771,806 B1 | 8/2004 | Satya et al. |
| 6,775,818 B2 | 8/2004 | Taravade et al. |
| 6,777,147 B1 | 8/2004 | Fonseca et al. |
| 6,777,676 B1 | 8/2004 | Wang et al. |
| 6,778,695 B1 | 8/2004 | Schellenberg et al. |
| 6,779,159 B2 | 8/2004 | Yokoyama et al. |
| 6,784,446 B1 | 8/2004 | Phan et al. |
| 6,788,400 B2 | 9/2004 | Chen |
| 6,789,032 B2 | 9/2004 | Barbour et al. |
| 6,803,554 B2 | 10/2004 | Ye et al. |
| 6,806,456 B1 | 10/2004 | Ye et al. |
| 6,807,503 B2 | 10/2004 | Ye et al. |
| 6,813,572 B2 | 11/2004 | Satya et al. |
| 6,820,028 B2 | 11/2004 | Ye et al. |
| 6,828,542 B2 | 12/2004 | Ye et al. |
| 6,842,225 B1 | 1/2005 | Irie |
| 6,859,746 B1 | 2/2005 | Stirton |
| 6,879,403 B2 | 4/2005 | Freifeld |
| 6,879,924 B2 | 4/2005 | Ye et al. |
| 6,882,745 B2 | 4/2005 | Brankner et al. |
| 6,884,984 B2 | 4/2005 | Ye et al. |
| 6,886,153 B1 | 4/2005 | Bevis |
| 6,892,156 B2 | 5/2005 | Ye et al. |
| 6,902,855 B2 | 6/2005 | Peterson et al. |
| 6,906,305 B2 | 6/2005 | Pease et al. |
| 6,918,101 B1 | 7/2005 | Satya et al. |
| 6,919,957 B2 | 7/2005 | Nikoonahad et al. |
| 6,937,753 B1 | 8/2005 | O'Dell et al. |
| 6,948,141 B1 | 9/2005 | Satya et al. |
| 6,959,255 B2 | 10/2005 | Ye et al. |
| 6,966,047 B1 | 11/2005 | Glasser |
| 6,969,837 B2 | 11/2005 | Ye et al. |
| 6,969,864 B2 | 11/2005 | Ye et al. |
| 6,983,060 B1 | 1/2006 | Martinent-Catalot et al. |
| 6,988,045 B2 | 1/2006 | Purdy |
| 6,990,385 B1 | 1/2006 | Smith et al. |
| 7,003,755 B2 | 2/2006 | Pang et al. |
| 7,003,758 B2 | 2/2006 | Ye et al. |
| 7,012,438 B1 | 3/2006 | Miller et al. |
| 7,026,615 B2 | 4/2006 | Takane et al. |
| 7,027,143 B1 | 4/2006 | Stokowski et al. |
| 7,030,966 B2 | 4/2006 | Hansen |
| 7,030,997 B2 | 4/2006 | Neureuther et al. |
| 7,053,355 B2 | 5/2006 | Ye et al. |
| 7,061,625 B1 | 6/2006 | Hwang et al. |
| 7,071,833 B2 | 7/2006 | Nagano et al. |
| 7,103,484 B1 | 9/2006 | Shi et al. |
| 7,106,895 B1 | 9/2006 | Goldberg et al. |
| 7,107,517 B1 | 9/2006 | Suzuki et al. |
| 7,107,571 B2 | 9/2006 | Chang et al. |
| 7,111,277 B2 | 9/2006 | Ye et al. |
| 7,114,143 B2 | 9/2006 | Hanson et al. |
| 7,114,145 B2 | 9/2006 | Ye et al. |
| 7,117,477 B2 | 10/2006 | Ye et al. |
| 7,117,478 B2 | 10/2006 | Ye et al. |
| 7,120,285 B1 | 10/2006 | Spence |
| 7,120,895 B2 | 10/2006 | Ye et al. |
| 7,123,356 B1 | 10/2006 | Stokowski et al. |
| 7,124,386 B2 | 10/2006 | Smith et al. |
| 7,133,070 B2 | 11/2006 | Wheeler |
| 7,133,548 B2 | 11/2006 | Kenan et al. |
| 7,135,344 B2 | 11/2006 | Nehmadi et al. |
| 7,136,143 B2 | 11/2006 | Smith |
| 7,152,215 B2 | 12/2006 | Smith et al. |
| 7,162,071 B2 | 1/2007 | Hung et al. |
| 7,170,593 B2 | 1/2007 | Honda et al. |
| 7,171,334 B2 | 1/2007 | Gassner |
| 7,174,520 B2 | 2/2007 | White et al. |
| 7,194,709 B2 | 3/2007 | Brankner |
| 7,207,017 B1 | 4/2007 | Tabery et al. |
| 7,231,628 B2 | 6/2007 | Pack et al. |
| 7,236,847 B2 | 6/2007 | Marella |
| 7,271,891 B1 | 9/2007 | Xiong et al. |
| 7,379,175 B1 | 5/2008 | Stokowski et al. |
| 7,383,156 B2 | 6/2008 | Matsusita et al. |
| 7,386,839 B1 | 6/2008 | Golender et al. |
| 7,388,979 B2 | 6/2008 | Sakai et al. |
| 7,418,124 B2 | 8/2008 | Peterson et al. |
| 7,424,145 B2 | 9/2008 | Horie et al. |
| 7,440,093 B1 | 10/2008 | Xiong et al. |
| 7,558,419 B1 | 7/2009 | Ye et al. |
| 7,570,796 B2 | 8/2009 | Zafar et al. |
| 7,676,077 B2 | 3/2010 | Kulkarni et al. |
| 7,683,319 B2 | 3/2010 | Makino et al. |
| 7,738,093 B2 | 6/2010 | Alles et al. |
| 7,739,064 B1 | 6/2010 | Ryker et al. |
| 7,752,584 B2 | 7/2010 | Yang |
| 7,760,929 B2 | 7/2010 | Orbon et al. |
| 7,877,722 B2 | 1/2011 | Duffy et al. |
| 7,890,917 B1 | 2/2011 | Young et al. |
| 7,904,845 B2 | 3/2011 | Fouquet et al. |
| 7,968,859 B2 | 6/2011 | Young et al. |
| 8,041,106 B2 | 10/2011 | Pak et al. |
| 8,073,240 B2 | 12/2011 | Fischer et al. |
| 8,126,255 B2 | 2/2012 | Bhaskar et al. |
| 8,223,327 B2 | 7/2012 | Chen et al. |
| 8,255,172 B2 | 8/2012 | Auerbach |
| 8,269,960 B2 | 9/2012 | Reich et al. |
| 8,605,275 B2 | 12/2013 | Chen et al. |
| 2001/0017694 A1 | 8/2001 | Oomori et al. |
| 2001/0019625 A1 | 9/2001 | Kenan et al. |
| 2001/0022858 A1 | 9/2001 | Komiya et al. |
| 2001/0043735 A1 | 11/2001 | Smargiassi et al. |
| 2002/0010560 A1 | 1/2002 | Balachandran |
| 2002/0019729 A1 | 2/2002 | Chang et al. |
| 2002/0026626 A1 | 2/2002 | Randall et al. |
| 2002/0033449 A1 | 3/2002 | Nakasuji et al. |
| 2002/0035461 A1 | 3/2002 | Chang et al. |
| 2002/0035641 A1 | 3/2002 | Kurose et al. |
| 2002/0035717 A1 | 3/2002 | Matsuoka |
| 2002/0054291 A1 | 5/2002 | Tsai et al. |
| 2002/0088951 A1 | 7/2002 | Chen |
| 2002/0090746 A1 | 7/2002 | Xu et al. |
| 2002/0134936 A1 | 9/2002 | Matsui et al. |
| 2002/0144230 A1 | 10/2002 | Rittman |
| 2002/0145734 A1 | 10/2002 | Watkins et al. |
| 2002/0164065 A1 | 11/2002 | Cai et al. |
| 2002/0168099 A1 | 11/2002 | Noy |
| 2002/0176096 A1 | 11/2002 | Sentoku et al. |
| 2002/0181756 A1 | 12/2002 | Shibuya et al. |
| 2002/0186878 A1 | 12/2002 | Hoon et al. |
| 2002/0192578 A1 | 12/2002 | Tanaka et al. |
| 2003/0004699 A1 | 1/2003 | Choi et al. |
| 2003/0014146 A1 | 1/2003 | Fujii et al. |
| 2003/0017664 A1 | 1/2003 | Pnueli et al. |
| 2003/0022401 A1 | 1/2003 | Hamamatsu et al. |
| 2003/0033046 A1 | 2/2003 | Yoshitake et al. |
| 2003/0048458 A1 | 3/2003 | Mieher et al. |
| 2003/0048939 A1 | 3/2003 | Lehman |
| 2003/0057971 A1 | 3/2003 | Nishiyama et al. |
| 2003/0076989 A1 | 4/2003 | Maayah et al. |
| 2003/0086081 A1 | 5/2003 | Lehman |
| 2003/0094572 A1 | 5/2003 | Matsui et al. |
| 2003/0098805 A1 | 5/2003 | Bizjak |
| 2003/0128870 A1 | 7/2003 | Pease et al. |
| 2003/0138138 A1 | 7/2003 | Vacca et al. |
| 2003/0138978 A1 | 7/2003 | Tanaka et al. |
| 2003/0169916 A1 | 9/2003 | Hayashi et al. |
| 2003/0173516 A1 | 9/2003 | Takane et al. |

(56) References Cited

U.S. PATENT DOCUMENTS

| | | |
|---|---|---|
| 2003/0192015 A1 | 10/2003 | Liu |
| 2003/0207475 A1 | 11/2003 | Nakasuji et al. |
| 2003/0223639 A1 | 12/2003 | Shlain et al. |
| 2003/0226951 A1 | 12/2003 | Ye et al. |
| 2003/0227620 A1 | 12/2003 | Yokoyama et al. |
| 2003/0228050 A1 | 12/2003 | Geshel et al. |
| 2003/0228714 A1 | 12/2003 | Smith et al. |
| 2003/0229410 A1 | 12/2003 | Smith et al. |
| 2003/0229412 A1 | 12/2003 | White et al. |
| 2003/0229868 A1 | 12/2003 | White et al. |
| 2003/0229875 A1 | 12/2003 | Smith et al. |
| 2003/0229880 A1 | 12/2003 | White et al. |
| 2003/0229881 A1 | 12/2003 | White et al. |
| 2003/0237064 A1 | 12/2003 | White et al. |
| 2004/0030430 A1 | 2/2004 | Matsuoka |
| 2004/0032908 A1 | 2/2004 | Hagai et al. |
| 2004/0049722 A1 | 3/2004 | Matsushita |
| 2004/0052411 A1 | 3/2004 | Qian et al. |
| 2004/0057611 A1 | 3/2004 | Lee et al. |
| 2004/0066506 A1 | 4/2004 | Elichai et al. |
| 2004/0091142 A1 | 5/2004 | Peterson et al. |
| 2004/0094762 A1 | 5/2004 | Hess et al. |
| 2004/0098216 A1 | 5/2004 | Ye et al. |
| 2004/0102934 A1 | 5/2004 | Chang |
| 2004/0107412 A1 | 6/2004 | Pack et al. |
| 2004/0119036 A1 | 6/2004 | Ye et al. |
| 2004/0120569 A1 | 6/2004 | Hung et al. |
| 2004/0133369 A1 | 7/2004 | Pack et al. |
| 2004/0147121 A1 | 7/2004 | Nakagaki et al. |
| 2004/0174506 A1 | 9/2004 | Smith |
| 2004/0179738 A1 | 9/2004 | Dai et al. |
| 2004/0199885 A1 | 10/2004 | Lu et al. |
| 2004/0223639 A1 | 11/2004 | Sato et al. |
| 2004/0228515 A1 | 11/2004 | Okabe et al. |
| 2004/0234120 A1 | 11/2004 | Honda et al. |
| 2004/0243320 A1 | 12/2004 | Chang et al. |
| 2004/0246476 A1 | 12/2004 | Bevis et al. |
| 2004/0254752 A1 | 12/2004 | Wisniewski et al. |
| 2005/0004774 A1 | 1/2005 | Volk et al. |
| 2005/0008218 A1 | 1/2005 | O'Dell et al. |
| 2005/0010890 A1 | 1/2005 | Nehmadi et al. |
| 2005/0013474 A1 | 1/2005 | Sim |
| 2005/0062962 A1 | 3/2005 | Fairley et al. |
| 2005/0069217 A1 | 3/2005 | Mukherjee |
| 2005/0117796 A1 | 6/2005 | Matsui et al. |
| 2005/0132306 A1 | 6/2005 | Smith et al. |
| 2005/0141764 A1 | 6/2005 | Tohyama et al. |
| 2005/0166174 A1 | 7/2005 | Ye et al. |
| 2005/0184252 A1 | 8/2005 | Ogawa et al. |
| 2005/0190957 A1 | 9/2005 | Cai et al. |
| 2005/0198602 A1 | 9/2005 | Brankner et al. |
| 2005/0249318 A1 | 11/2005 | Minemura |
| 2006/0000964 A1 | 1/2006 | Ye et al. |
| 2006/0036979 A1 | 2/2006 | Zurbrick et al. |
| 2006/0038986 A1 | 2/2006 | Honda et al. |
| 2006/0048089 A1 | 3/2006 | Schwarzband |
| 2006/0051682 A1 | 3/2006 | Hess et al. |
| 2006/0062445 A1 | 3/2006 | Verma et al. |
| 2006/0066339 A1 | 3/2006 | Rajski et al. |
| 2006/0078192 A1 | 4/2006 | Oh |
| 2006/0082763 A1 | 4/2006 | Teh et al. |
| 2006/0083135 A1 | 4/2006 | Minemura |
| 2006/0159333 A1 | 7/2006 | Ishikawa |
| 2006/0161452 A1 | 7/2006 | Hess |
| 2006/0193506 A1 | 8/2006 | Dorphan et al. |
| 2006/0193507 A1 | 8/2006 | Sali et al. |
| 2006/0236294 A1 | 10/2006 | Saidin et al. |
| 2006/0236297 A1 | 10/2006 | Melvin, III et al. |
| 2006/0239536 A1 | 10/2006 | Shibuya et al. |
| 2006/0265145 A1 | 11/2006 | Huet et al. |
| 2006/0266243 A1 | 11/2006 | Percin et al. |
| 2006/0269120 A1 | 11/2006 | Nehmadi et al. |
| 2006/0273242 A1 | 12/2006 | Hunsche et al. |
| 2006/0273266 A1 | 12/2006 | Preil et al. |
| 2006/0277520 A1 | 12/2006 | Gennari |
| 2006/0291714 A1 | 12/2006 | Wu et al. |
| 2006/0292463 A1 | 12/2006 | Best et al. |
| 2007/0002322 A1 | 1/2007 | Borodovsky et al. |
| 2007/0011628 A1 | 1/2007 | Ouali et al. |
| 2007/0013901 A1 | 1/2007 | Kim et al. |
| 2007/0019171 A1 | 1/2007 | Smith |
| 2007/0019856 A1 | 1/2007 | Furman et al. |
| 2007/0031745 A1 | 2/2007 | Ye et al. |
| 2007/0032896 A1 | 2/2007 | Ye et al. |
| 2007/0035322 A1 | 2/2007 | Kang et al. |
| 2007/0035712 A1 | 2/2007 | Gassner et al. |
| 2007/0035728 A1 | 2/2007 | Kekare et al. |
| 2007/0052963 A1 | 3/2007 | Orbon et al. |
| 2007/0064995 A1 | 3/2007 | Oaki et al. |
| 2007/0133860 A1 | 6/2007 | Lin et al. |
| 2007/0156379 A1* | 7/2007 | Kulkarni et al. ............... 703/14 |
| 2007/0230770 A1 | 10/2007 | Kulkarni et al. |
| 2007/0248257 A1 | 10/2007 | Bruce et al. |
| 2007/0280527 A1 | 12/2007 | Almogy et al. |
| 2007/0288219 A1 | 12/2007 | Zafar et al. |
| 2008/0013083 A1 | 1/2008 | Kirk et al. |
| 2008/0015802 A1 | 1/2008 | Urano et al. |
| 2008/0016481 A1 | 1/2008 | Matsuoka et al. |
| 2008/0049994 A1 | 2/2008 | Rognin et al. |
| 2008/0058977 A1 | 3/2008 | Honda |
| 2008/0072207 A1 | 3/2008 | Verma et al. |
| 2008/0081385 A1 | 4/2008 | Marella et al. |
| 2008/0163140 A1 | 7/2008 | Fouquet et al. |
| 2008/0167829 A1 | 7/2008 | Park et al. |
| 2008/0250384 A1 | 10/2008 | Duffy et al. |
| 2008/0295047 A1 | 11/2008 | Nehmadi et al. |
| 2008/0295048 A1 | 11/2008 | Nehmadi et al. |
| 2008/0304056 A1 | 12/2008 | Alles et al. |
| 2009/0024967 A1 | 1/2009 | Su et al. |
| 2009/0037134 A1 | 2/2009 | Kulkarni et al. |
| 2009/0041332 A1 | 2/2009 | Bhaskar et al. |
| 2009/0043527 A1 | 2/2009 | Park et al. |
| 2009/0055783 A1 | 2/2009 | Florence et al. |
| 2009/0067703 A1 | 3/2009 | Lin et al. |
| 2009/0080759 A1 | 3/2009 | Bhaskar et al. |
| 2009/0210183 A1 | 8/2009 | Rajski et al. |
| 2009/0257645 A1 | 10/2009 | Chen et al. |
| 2009/0284733 A1 | 11/2009 | Wallingford et al. |
| 2009/0290782 A1 | 11/2009 | Regensburger |
| 2009/0310864 A1 | 12/2009 | Takagi et al. |
| 2009/0323052 A1 | 12/2009 | Silberstein et al. |
| 2010/0076699 A1 | 3/2010 | Auerbach |
| 2010/0142800 A1 | 6/2010 | Pak et al. |
| 2010/0146338 A1 | 6/2010 | Schalick et al. |
| 2010/0150429 A1 | 6/2010 | Jau et al. |
| 2011/0013825 A1 | 1/2011 | Shibuya et al. |
| 2011/0052040 A1 | 3/2011 | Kuan |
| 2011/0129142 A1 | 6/2011 | Takahashi et al. |
| 2011/0184662 A1 | 7/2011 | Badger et al. |
| 2011/0188733 A1 | 8/2011 | Bardos et al. |
| 2011/0251713 A1 | 10/2011 | Teshima et al. |
| 2011/0311126 A1 | 12/2011 | Sakai et al. |
| 2011/0320149 A1 | 12/2011 | Lee et al. |
| 2012/0229618 A1 | 9/2012 | Urano et al. |
| 2012/0319246 A1 | 12/2012 | Tan et al. |
| 2013/0009989 A1 | 1/2013 | Chen et al. |
| 2013/0027196 A1 | 1/2013 | Yankun et al. |
| 2013/0064442 A1 | 3/2013 | Chang et al. |
| 2013/0129189 A1 | 5/2013 | Wu et al. |
| 2013/0236084 A1 | 9/2013 | Li et al. |
| 2014/0002632 A1 | 1/2014 | Lin et al. |
| 2014/0050389 A1 | 2/2014 | Mahadevan et al. |
| 2014/0185919 A1 | 7/2014 | Lang et al. |
| 2014/0193065 A1 | 7/2014 | Chu et al. |
| 2014/0219544 A1 | 8/2014 | Wu et al. |

FOREIGN PATENT DOCUMENTS

| | | |
|---|---|---|
| CN | 1646896 | 7/2005 |
| CN | 101275920 | 10/2008 |
| EP | 0032197 | 7/1981 |
| EP | 0370322 | 5/1990 |
| EP | 1061358 | 12/2000 |
| EP | 1061571 | 12/2000 |

(56) References Cited

FOREIGN PATENT DOCUMENTS

| | | |
|---|---|---|
| EP | 1065567 | 1/2001 |
| EP | 1066925 | 1/2001 |
| EP | 1069609 | 1/2001 |
| EP | 1093017 | 4/2001 |
| EP | 1329771 | 7/2003 |
| EP | 1480034 | 11/2004 |
| EP | 1696270 | 8/2006 |
| JP | 7-159337 | 6/1995 |
| JP | 2002071575 | 3/2002 |
| JP | 2002365235 | 12/2002 |
| JP | 2003-215060 | 7/2003 |
| JP | 2004045066 | 2/2004 |
| JP | 2005-283326 | 10/2005 |
| JP | 2007-234798 | 9/2007 |
| JP | 2009-122046 | 6/2009 |
| JP | 2010-256242 | 11/2010 |
| JP | 2012-225768 | 11/2012 |
| KR | 10-2001-0007394 | 1/2001 |
| KR | 10-2001-0037026 | 5/2001 |
| KR | 10-2001-0101697 | 11/2001 |
| KR | 1020030055848 | 7/2003 |
| KR | 1020050092053 | 9/2005 |
| KR | 10-2006-0075691 | 7/2006 |
| KR | 10-2006-0124514 | 12/2006 |
| KR | 10-0696276 | 3/2007 |
| KR | 10-2010-0061018 | 6/2010 |
| KR | 10-2012-0068128 | 6/2012 |
| WO | 9857358 | 12/1998 |
| WO | 9922310 | 5/1999 |
| WO | 9925004 | 5/1999 |
| WO | 9959200 | 5/1999 |
| WO | 9938002 | 7/1999 |
| WO | 9941434 | 8/1999 |
| WO | 0003234 | 1/2000 |
| WO | 0036525 | 6/2000 |
| WO | 0055799 | 9/2000 |
| WO | 0068884 | 11/2000 |
| WO | 0070332 | 11/2000 |
| WO | 0109566 | 2/2001 |
| WO | 0140145 | 6/2001 |
| WO | 03104921 | 12/2003 |
| WO | 2004027684 | 4/2004 |
| WO | 2006063268 | 6/2006 |
| WO | 2010/093733 | 8/2010 |

OTHER PUBLICATIONS

Granik et al., "Sub-resolution process windows and yield estimation technique based on detailed full-chip CD simulation," Mentor Graphics, Sep. 2000, 5 pages.

Hess et al., "A Novel Approach: High Resolution Inspection with Wafer Plane Defect Detection," Proceedings of SPIE—International Society for Optical Engineering; Photomask and Next-Generation Lithography Mask Technology 2008, vol. 7028, 2008.

Huang et al., "Process Window Impact of Progressive Mask Defects, Its Inspection and Disposition Techniques (go/no-go criteria) Via a Lithographic Detector," Proceedings of SPIE—The International Society for Optical Engineering; 25th Annual Bacus Symposium on Photomask Technology 2005, vol. 5992, No. 1, 2005, p. 6.

Hung et al., Metrology Study of Sub 20 Angstrom oxynitride by Corona-Oxide-Silicon (COS) and Conventional C-V Approaches, 2002, Mat. Res. Soc. Symp. Proc., vol. 716, pp. 119-124.

International Search Report for PCT/US2003/021907 mailed Jun. 7, 2004.

International Search Report for PCT/US2004/040733 mailed Dec. 23, 2005.

International Search Report for PCT/US2006/061112 mailed Sep. 25, 2008.

International Search Report for PCT/US2006/061113 mailed Jul. 16, 2008.

International Search Report for PCT/US2008/050397 mailed Jul. 11, 2008.

International Search Report for PCT/US2008/062873 mailed Aug. 12, 2008.

International Search Report for PCT/US2008/062875 mailed Sep. 10, 2008.

International Search Report for PCT/US2008/063008 mailed Aug. 18, 2008.

International Search Report for PCT/US2008/066328 mailed Oct. 1, 2009.

International Search Report for PCT/US2008/070647 mailed Dec. 16, 2008.

International Search Report for PCT/US2008/072636 mailed Jan. 29, 2009.

International Search Report for PCT/US2008/073706 mailed Jan. 29, 2009.

International Search Report for PCT/US2009/051961 mailed Mar. 16, 2010.

Karklin et al., "Automatic Defect Severity Scoring for 193 nm Reticle Defect Inspection," Proceedings of SPIE—The International Society for Optical Engineering, 2001, vol. 4346, No. 2, pp. 898-906.

Lo et al., "Identifying Process Window Marginalities of Reticle Designs for 0.15/0.13 µm Technologies," Proceedings of SPIE vol. 5130, 2003, pp. 829-837.

Lorusso et al. "Advanced DFM Applns. Using design-based metrology on CDSEM," SPIE vol. 6152, Mar. 27, 2006.

Lu et al., "Application of Simulation Based Defect Printability Analysis for Mask Qualification Control," Proceedings of SPIE, vol. 5038, 2003, pp. 33-40.

Mack, "Lithographic Simulation: A Review," Proceedings of SPIE vol. 4440, 2001, pp. 59-72.

Martino et al., "Application of the Aerial Image Measurement System (AIMS(TM)) to the Analysis of Binary Mask Imaging and Resolution Enhancement Techniques," SPIE vol. 2197, 1994, pp. 573-584.

Miller, "A New Approach for Measuring Oxide Thickness," Semiconductor International, Jul. 1995, pp. 147-148.

Nagpal et al., "Wafer Plane Inspection for Advanced Reticle Defects," Proceedings of SPIE—The International Society for Optical Engineering; Photomask and Next-Generation Lithography Mask Technology. vol. 7028, 2008.

Numerical Recipes in C. The Art of Scientific Computing, 2nd Ed.,@ Cambridge University Press 1988, 1992, p. 683.

O'Gorman et al., "Subpixel Registration Using a Concentric Ring Fiducial," Proceedings of the International Conference on Pattern Recognition, vol. ii, Jun. 16, 1990, pp. 249-253.

Otsu, "A Threshold Selection Method from Gray-Level Histograms," IEEE Transactions on Systems, Man, and Cybernetics, vol. SMC-9, No. 1, Jan. 1979, pp. 62-66.

Pang et al., "Simulation-based Defect Printability Analysis on Alternating Phase Shifting Masks for 193 nm Lithography," Proceedings of SPIE, vol. 4889, 2002, pp. 947-954.

Pettibone et al., "Wafer Printability Simulation Accuracy Based on UV Optical Inspection Images of Reticle Defects," Proceedings of SPIE—The International Society for Optical Engineering 1999 Society of Photo-Optical Instrumentation Engineers, vol. 3677, No. II, 1999, pp. 711-720.

Phan et al., "Comparison of Binary Mask Defect Printability Analysis Using Virtual Stepper System and Aerial Image Microscope System," Proceedings of SPIE—The International Society for Optical Engineering 1999 Society of Photo-Optical Instrumentation Engineers, vol. 3873, 1999, pp. 681-692.

Sahouria et al., "Full-chip Process Simulation for Silicon DRC," Mentor Graphics, Mar. 2000, 6 pages.

Schroder et al., Corona-Oxide-Semiconductor Device Characterization, 1998, Solid-State Electronics, vol. 42, No. 4, pp. 505-512.

Schroder, "Surface voltage and surface photovoltage: history, theory and applications," Measurement Science and Technology, vol. 12, 2001, pp. R16-31.

Schroder, Contactless Surface Charge Semiconductor Characterization, Apr. 2002, Materials Science and Engineering B, vol. 91-92, pp. 196-228.

(56) References Cited

OTHER PUBLICATIONS

Schurz et al., "Simulation Study of Reticle Enhancement Technology Applications for 157 nm Lithography," SPIE vol. 4562, 2002, pp. 902-913.
Svidenko et al. "Dynamic Defect-Limited Yield Prediction by Criticality Factor," ISSM Paper: YE-O-157, 2007.
Tang et al., "Analyzing Volume Diagnosis Results with Statistical Learning for Yield Improvement" 12th IEEE European Test Symposium, Freiburg 2007, IEEE European, May 20-24, 2007, pp. 145-150.
Verkuil et al., "A Contactless Alternative to MOS Charge Measurements by Means of a Corona-Oxide-Semiconductor (COS) Technique," Electrochem. Soc. Extended Abstracts, 1988, vol. 88-1, No. 169, pp. 261-262.
Verkuil, "Rapid Contactless Method for Measuring Fixed Oxide Charge Associated with Silicon Processing," IBM Technical Disclosure Bulletin, vol. 24, No. 6, 1981, pp. 3048-3053.
Volk et al. "Investigation of Reticle Defect Formation at DUV Lithography," 2002, BACUS Symposium on Photomask Technology.
Volk et al. "Investigation of Reticle Defect Formation at DUV Lithography," 2003, IEEE/SEMI Advanced Manufacturing Conference, pp. 29-35.
Volk et al., "Investigation of Smart Inspection of Critical Layer Reticles using Additional Designer Data to Determine Defect Significance," Proceedings of SPIE vol. 5256, 2003, pp. 489-499.
Weinberg, "Tunneling of Electrons from Si into Thermally Grown SiO2," Solid-State Electronics, 1977, vol. 20, pp. 11-18.
Weinzierl et al., "Non-Contact Corona-Based Process Control Measurements: Where We've Been, Where We're Headed," Electrochemical Society Proceedings, Oct. 1999, vol. 99-16, pp. 342-350.
Yan et al., "Printability of Pellicle Defects in DUV 0.5 um Lithography," SPIE vol. 1604, 1991, pp. 106-117.
Huang et al., "Using Design Based Binning to Improve Defect Excursion Control for 45nm Production," IEEE, International Symposium on Semiconductor Manufacturing, Oct. 2007, pp. 1-3.
Sato et al., "Defect Criticality Index (DCI): A new methodology to significantly improve DOI sampling rate in a 45nm production environment," Metrology, Inspection, and Process Control for Microlithography XXII, Proc. of SPIE vol. 6922, 692213 (2008), pp. 1-9.
U.S. Appl. No. 60/418,994, filed Oct. 15, 2002 by Stokowski et al.
U.S. Appl. No. 60/419,028, filed Oct. 15, 2002 by Stokowski et al.
U.S. Appl. No. 60/451,707, filed Mar. 4, 2003 by Howard et al.
U.S. Appl. No. 60/485,233, filed Jul. 7, 2003 by Peterson et al.
U.S. Appl. No. 60/526,881, filed Dec. 4, 2003 by Hess et al.
U.S. Appl. No. 60/609,670, filed Sep. 14, 2004 by Preil et al.
U.S. Appl. No. 60/681,095, filed May 13, 2005 by Nehmadi et al.
U.S. Appl. No. 60/684,360, filed May 24, 2005 by Nehmadi et al.
U.S. Appl. No. 60/738,290, filed Nov. 18, 2005 by Kulkarni et al.
U.S. Appl. No. 60/772,418, filed Feb. 9, 2006 by Kirk et al.
U.S. Appl. No. 10/778,752, filed Feb. 13, 2004 by Preil et al.
U.S. Appl. No. 10/793,599, filed Mar. 4, 2004 by Howard et al.
U.S. Appl. No. 11/139,151, filed Feb. 10, 2005 by Volk.
U.S. Appl. No. 11/154,310, filed Feb. 10, 2002 by Verma et al.
U.S. Appl. No. 12/102,343, filed Apr. 14, 2008 by Chen et al.
U.S. Appl. No. 12/394,752, filed Feb. 27, 2009 by Xiong et al.
U.S. Appl. No. 12/403,905, filed Mar. 13, 2009 by Xiong.
Allan et al., "Critical Area Extraction for Soft Fault Estimation," IEEE Transactions on Semiconductor Manufacturing, vol. 11, No. 1, Feb. 1998.
Barty et al., "Aerial Image Microscopes for the inspection of defects in EUV masks," Proceedings of SPIE, vol. 4889, 2002, pp. 1073-1084.
Budd et al., "A New Mask Evaluation Tool, the Microlithography Simulation Microscope Aerial Image Measurement System," SPIE vol. 2197, 1994, pp. 530-540.
Cai et al., "Enhanced Dispositioning of Reticle Defects Using the Virtual Stepper With Automated Defect Severity Scoring," Proceedings of the SPIE, vol. 4409, Jan. 2001, pp. 467-478.
Comizzoli, "Uses of Corona Discharges in the Semiconductor Industry," J. Electrochem. Soc., 1987, pp. 424-429.
Contactless Electrical Equivalent Oxide Thickness Measurement, IBM Technical Disclosure Bulletin, vol. 29, No. 10, 1987, pp. 4622-4623.
Contactless Photovoltage vs. Bias Method for Determining Flat-Band Voltage, IBM Technical Disclosure Bulletin, vol. 32, vol. 9A, 1990, pp. 14-17.
Cosway et al., "Manufacturing Implementation of Corona Oxide Silicon (COS) Systems for Diffusion Furnace Contamination Monitoring," 1997 IEEE/SEMI Advanced Semiconductor Manufacturing Conference, pp. 98-102.
Diebold et al., "Characterization and production metrology of thin transistor gate oxide films," Materials Science in Semiconductor Processing 2, 1999, pp. 103-147.
Dirksen et al., "Impact of high order aberrations on the performance of the aberration monitor," Proc. Of SPIE vol. 4000, Mar. 2000, pp. 9-17.
Dirksen et al., "Novel aberration monitor for optical lithography," Proc. Of SPIE vol. 3679, Jul. 1999, pp. 77-86.
U.S. Appl. No. 13/652,377, filed Oct. 15, 2012 by Wu et al.
Guo et al., "License Plate Localization and Character Segmentation with Feedback Self-Learning and Hybrid Binarization Techniques," IEEE Transactions on Vehicular Technology, vol. 57, No. 3, May 2008, pp. 1417-1424.
Liu, "Robust Image Segmentation Using Local Median," Proceedings of the 3rd Canadian Conference on Computer and Robot Vision (CRV'06) 0-7695-2542-3/06, 2006 IEEE, 7 pages total.
Gu et al., "Lossless Compression Algorithms for Hierarchical IC Layout," IEEE Transactions on Semiconductor Manufacturing, vol. 21, No. 2, May 2008, pp. 285-296.

\* cited by examiner

COMPUTER-IMPLEMENTED METHODS, COMPUTER-READABLE MEDIA, AND SYSTEMS FOR CLASSIFYING DEFECTS DETECTED IN A MEMORY DEVICE AREA ON A WAFER

CROSS-REFERENCE TO RELATED APPLICATIONS

This application is a National Stage application of International Application No. PCT/US09/51961 filed Jul. 28, 2009, which claims priority to U.S. Provisional Application No, 61/137,274 entitled "Location Based Defect Classification on Memory Block," filed Jul. 28, 2008, which is incorporated by reference as if fully set forth herein.

BACKGROUND OF THE INVENTION

1. Field of the Invention

The present invention generally relates to computer-implemented methods, computer-readable media, and systems for classifying defects detected in a memory device area on a wafer. Certain embodiments relate to classifying defects detected in a memory device area on a wafer based on positions of the defects within the different types of blocks in the memory device area in which the defects are located.

2. Description of the Related Art

The following description and examples are not admitted to be prior art by virtue of their inclusion in this section.

Memory devices such as DRAM and Flash memory include repeating blocks (e.g., memory cell block, sense/amplifier block, wordline driver block, conjunction, and others). More than about 80% of memory devices can be occupied by a memory cell block. The memory cell block includes repeating structures. For example, the memory cell block may include 2 F~8 F repetitive structures having the same pattern background.

Currently used methods for classifying defects include using the design background or defect attributes to classify the detects. One such method for classifying defects is design based binning (DBB). Examples of DBB are described in commonly owned U.S. patent application Ser. No. 11/561,659 by Zafar et al., published as U.S. Patent Application Publication No. 2007/0288219 on Dec. 13, 2007, which was filed on Nov. 20, 2006, and which is incorporated by reference as if fully set forth herein. DBB, in general, can be described as pattern based binning that may use graphical data stream (GDS) clips. For example, DBB may include extracting design clips corresponding to locations of defects detected on a wafer, comparing the clips against themselves, and binning the defects into groups such that the clips for the defects in each of the groups are substantially the same. Therefore, defects having the same pattern background are classified into the same bin. DBB may also include generating results such as a pareto chart showing the number of defects in each of the pattern based groups. In addition, DBB can involve using design and inspection information to identify and classify potential systematic pattern problems.

However, memory blocks have repeating structures, which means that the design background provides little or no differentiation for defects as design rules continue to shrink. In particular, since defects in memory device areas will in general have the same pattern background, DBB does not provide differentiation among different defects because different defects will have the same pattern background and will thereby be binned into the same group. In this manner, for memory devices, it is not helpful to use the design background for defect classification. Therefore, although DBB methods and systems have proven to be extremely useful in a number of applications, DBB is difficult to use for memory devices. In particular, DBB will have substantially limited use for DRAM and Flash memory devices.

Accordingly, it would be advantageous to develop more effective methods and systems for classifying defects detected in a memory device area on a wafer.

SUMMARY OF THE INVENTION

The following description of various embodiments of computer-implemented methods, computer-readable media, and systems is not to be construed in any way as limiting the subject matter of the appended claims.

One embodiment relates to a computer-implemented method for classifying defects detected on a memory device area on a wafer. The method includes using a computer system to perform the following steps. The steps of the method include determining positions of inspection data acquired for the memory device area by an inspection system. The memory device area includes different types of blocks. The inspection data includes data for defects detected in the memory device area. The steps of the method also include determining positions of the defects with respect to a predetermined location within the blocks in which the defects are located based on the positions of the inspection data, in addition, the steps of the method include classifying the defects based on the positions of the defects within the blocks.

Each of the steps of the computer-implemented method described above may be further performed as described herein. In addition, the computer-implemented method described above may include any other step(s) of any other method(s) described herein. Furthermore, the computer-implemented method described above may be performed by any of the systems described herein.

Another embodiment relates to a computer-readable medium storing program instructions executable on a computer system for performing a computer-implemented method for classifying defects detected in a memory device area on a wafer. The computer-implemented method includes the steps of the computer-implemented method described above.

The computer-readable medium described above may be further configured according to any of the embodiment(s) described herein. Each of the steps of the computer-implemented method executable by the program instructions may be further performed as described herein. In addition, the computer-implemented method executable by the program instructions may include any other stem's) of any other method(s) described herein.

An additional embodiment relates to a system configured to classify defects detected in a memory device area on a wafer. The system includes an inspection subsystem configured to acquire inspection data for the memory device area formed on the wafer. The memory device area includes different types of blocks. The inspection data includes data for defects detected in the memory device area. The system also includes a computer subsystem configured to determine positions of the inspection data, determine positions of the defects with respect to a predetermined location within the blocks in which the defects are located based on the positions of the inspection data, and classify the defects based on the positions of the defects within the blocks.

The embodiment of the system described above may be further configured according to any of the embodiment(s) described herein. In addition, the embodiment of the system described above may be configured to perform any step(s) of any method embodiment(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
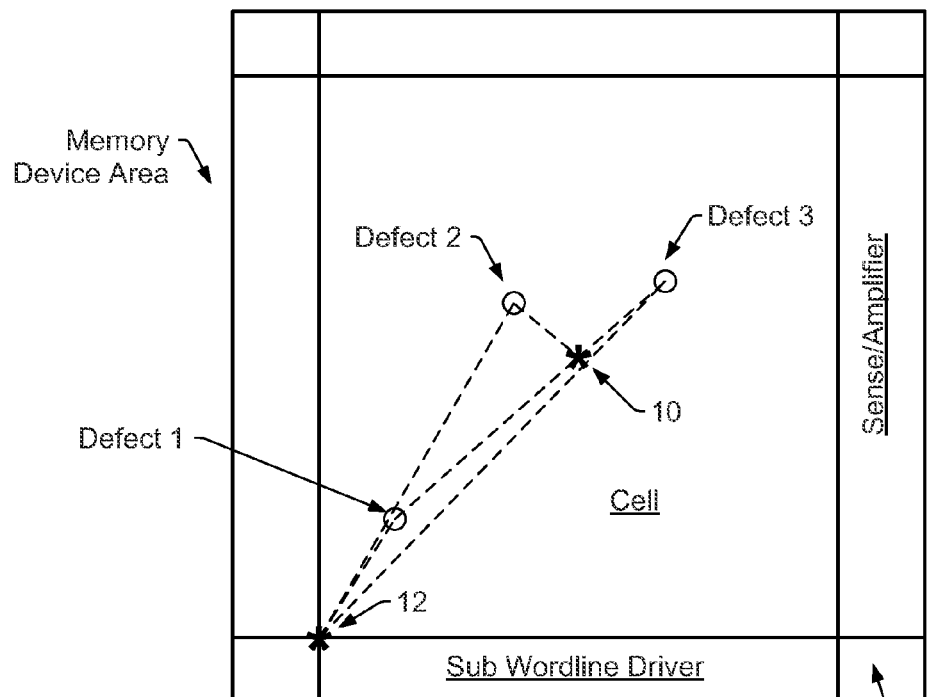
FIG. 1 is a schematic diagram illustrating one example of positions of defects determined with respect to a predetermined location within a block of a memory device area in which the defects are located.

While the invention is susceptible to various modifications and alternative forms, specific embodiments thereof are shown by way of example in the drawings and herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

One embodiment relates to a computer-implemented method for classifying defects detected in a memory device area on a wafer. For example, the method may be used to classify defects detected on memory blocks in DRAM, Flash memory, and SRAM areas in logic devices. As described further herein, the embodiments described herein will provide significant yield improvement, especially for memory manufacturers suffering from defects on memory blocks.

The method includes using a computer system to perform the following steps. The computer system may be configured as described further herein. The steps of the method include determining positions of inspection data acquired for the memory device area by an inspection system. In one embodiment, determining the positions of the inspection data includes determining the positions of the inspection data in design data space. Determining the positions of the inspection data in design data space may be performed as described in commonly owned U.S. patent application Ser. No. 11/561,735 by Kulkarni et al. filed on Nov. 20, 2006, published as U.S. Patent Application Publication No. 2007/0156379 on Jul. 5, 2007, which is incorporated by reference as if fully set forth herein. For example, determining the positions of the inspection data in design data space may include aligning a portion of the inspection data to design data for the memory device area being formed on the wafer thereby determining the positions of the inspection data in design data space. The design data may include any design data or design data proxies described in the above-referenced patent application by Kulkarni et. al.

The memory device area includes different types of blocks. For example, as shown in FIG. 1, in a typical DRAM memory unit, a memory device area may include different types of blocks including a cell block, a sub wordline driver (SWD) block, a sense/amplifier (S/A) block, and a conjunction block. The different types of blocks may be different in that they include different repeating structures (or repeating structures that have at least one different characteristic) and have different electrical functions.

The inspection data includes data for defects detected in the memory device area. The inspection data may include any suitable inspection data that can be acquired for the memory device area by an inspection system. The inspection system may be a bright field (BF) inspection system, a dark field (DF) inspection system, or a BF and inspection system. The inspection system may acquire the inspection data by scanning light over the wafer, detecting light reflected and/or scattered from the wafer, and generating the inspection data in response to the detected light. The inspection system may detect defects in the memory device area in any suitable manner.

The method also includes determining positions of the defects with respect to a predetermined location within the blocks in which the defects are located based on the positions of the inspection data. In other words, the positions of the defects in each different block are determined with respect to the predetermined location within each different block. For example, the positions of the defects in the memory cell block are determined with respect to a predetermined location in the memory cell block, the positions of the defects in the SWD block are determined with respect to a predetermined location in the SWD block, etc. In one embodiment, the predetermined location includes a center or a corner of the blocks. The corner of the block may be a lower left corner of the block. For example, as shown in FIG. 1, three defects (Defect 1, Defect 2, and Defect 3) may be detected in the cell block of the memory device area. Therefore, the positions of the defects may be determined with respect to center 10 of the cell block or lower left corner 12 of the cell block. In addition, the positions of the defects are relative positions with respect to the center or the lower left corner of the cell block as illustrated in FIG. 1 by the dashed lines between the center of each defect and the center and lower left corner of the cell block.

In one embodiment, determining the positions of the defects includes determining the positions of the defects with respect to the predetermined location in design data space. For example, as described above, the method may include determining the design data space positions of the inspection data. Therefore, determining the positions of the inspection data in design data space may involve determining the positions of the inspection data corresponding to the defects as well as the predetermined locations design data space. In this manner, the positions of the defects with respect to the predetermined location can be determined in design data space. As such, the coordinates of the positions of the defects with respect to the predetermined location can come from the design data that corresponds to the inspection defect location. For example, as described above, the positions of the defects are determined relative to the predetermined location (e.g., inspection die corner) within the blocks in which the defects are located. Therefore, to get the defect coordinates relative to the predetermined location (e.g., the center or tower left corner) of the block, the design data can be used that will have all of the layout information.

In one embodiment, determining the positions of the inspection data includes determining the positions of the inspection data in inspection data space, and determining the positions of the defects includes determining the positions of the defects with respect to the predetermined location in the inspection data space. For example, using design space can be the best way to get accurate defect coordinates and to be combined with design based binning (DBB). However, there are two alternative ways to get defect coordinates that could be used to classify the defects as described further herein. One alternative to get the defect coordinates is to use design data (e.g., graphical data stream (GDS)) to generate inspection care area groups (which may be commonly referred to as "GDStoCA"). GDStoCA can be used to define different types of blocks, and the inspection system can report the defect coordinates with respect to the predetermined location. Another way to get the defect coordinates is to use manually drawn inspection care areas and to group the care areas into different types of blocks. The inspection system can then report the defect coordinates with respect to the predetermined location. Therefore, the coordinates of the positions of the defects with respect to the predetermined location can come from a.) the design data that corresponds to the inspection defect location, design data space; b.) the inspection defect location based on inspection care areas drawn by design data (e.g., GDStoCA), inspection data space; or c.) the inspection defect location based on inspection care areas drawn and grouped manually, inspection data space. Examples of methods and systems that can be used for determining the inspection defect location based on the inspection care areas drawn by GDStoCA are illustrated in commonly owned U.S. Pat. No. 6,529,621 to Glasser et al., U.S. Pat. No. 6,748,103 to Glasser et al., and U.S. Pat. No. 6,886,153 to Bevis, which are incorporated by reference as if fully set forth herein.

In one embodiment, the method includes reporting x, y addresses of the different types of blocks within the memory device area and the positions of the defects within the blocks. In one such embodiment, the positions of the defects within the blocks include x, y locations with respect to the predetermined location within the blocks. For example, the data that can be reported by the methods described herein include memory block x, y address and defect x, y location with respect to the tower left corner or the center of each block.

The method further includes classifying the defects based on the positions of the defects within the blocks. Therefore, the method includes location-based defect classification in memory block. As described above, the predetermined location may include a center or a corner (e.g., the lower left corner) of the blocks. Therefore, classifying the defects may include classifying the defects based on the relative location of the defects to the lower left corner or the center of the block. In other words, classifying the defects may include binning the defects based on the relative location to the lower left corner or the center of the block. Classifying the defects may be further performed as described herein.

In one embodiment, classifying the defects includes classifying the defects based on the positions of the defects within the blocks and the types of the blocks in which the defects are located. For example, classifying the defects may include classifying the defects by block (e.g., memory cell, S/A, SWD, etc.). In particular, different types of blocks such as cell block, S/A block, SWD block, conjunction block, etc. can be found in the inspection data, which allows binning (and sampling) of defect by block type. In this manner, detects in different types of blocks can be included in different bins, and different types of defects in each of the different types of blocks may also be included in different bins (or different sub-bins).

In another embodiment, classifying the defects includes determining if the defects are systematic defects. Determining if the defects are systematic defects may be performed in various manners as described further herein.

Figure 2:
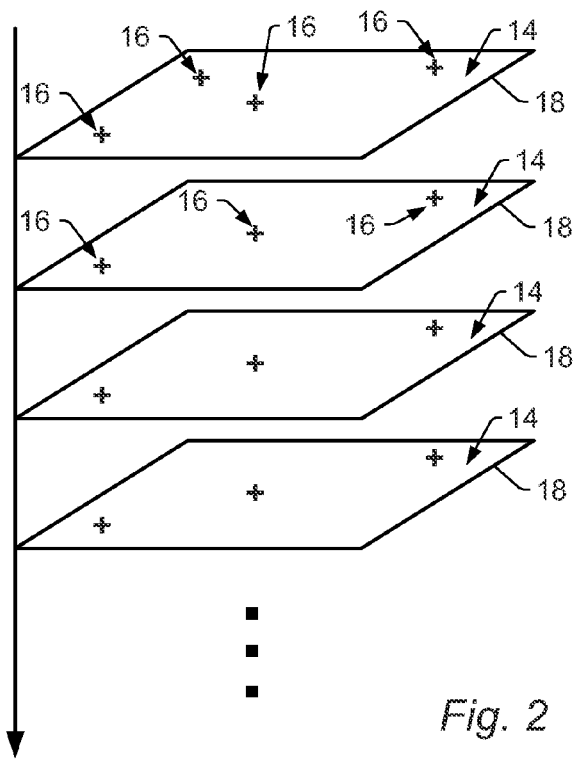
FIG. 2 is a schematic diagram illustrating one example of stacking inspection data for multiple blocks in a memory device area having the same type.

In some embodiments, classifying the defects includes stacking the inspection data for multiple blocks having the same type to separate the defects into systematic defect bins or random defect bins. For example, classifying the defects may include stacking the cell area to identify systematic defects. In addition, different types of blocks within the memory device area may be separately stacked. For example, S/A, SWD, and conjunction blocks may be stacked separately from the memory cell blocks. In one such example, as shown in FIG. 2, inspection data 14, which includes inspection data for defects 16, for multiple blocks 18 having the same type may be stacked. Such stacking may be performed for the cell block area. Although four multiple blocks are shown in FIG. 2, the inspection data for any number of multiple blocks can be stacked.

Figure 3:
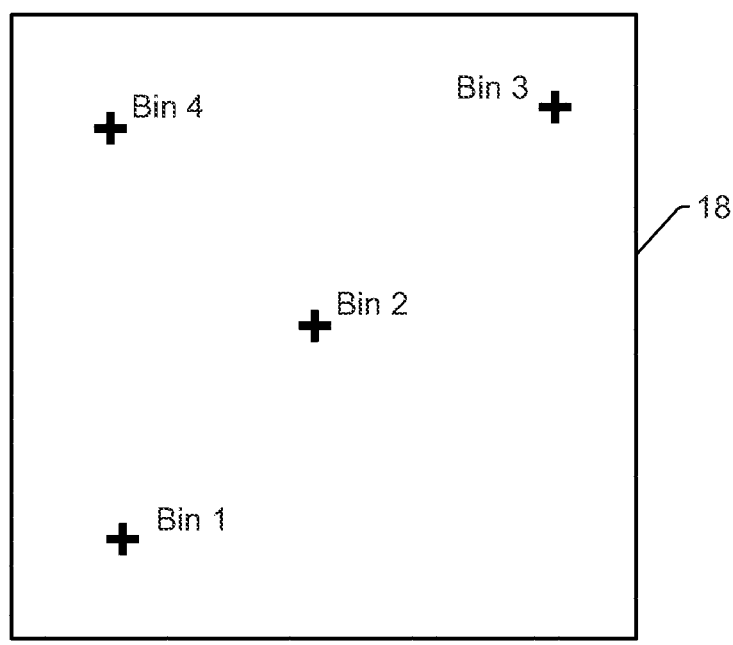
FIG. 3 is a schematic diagram illustrating one example of separation of defects into bins by stacking inspection data as shown in FIG. 2.
Figure 4:
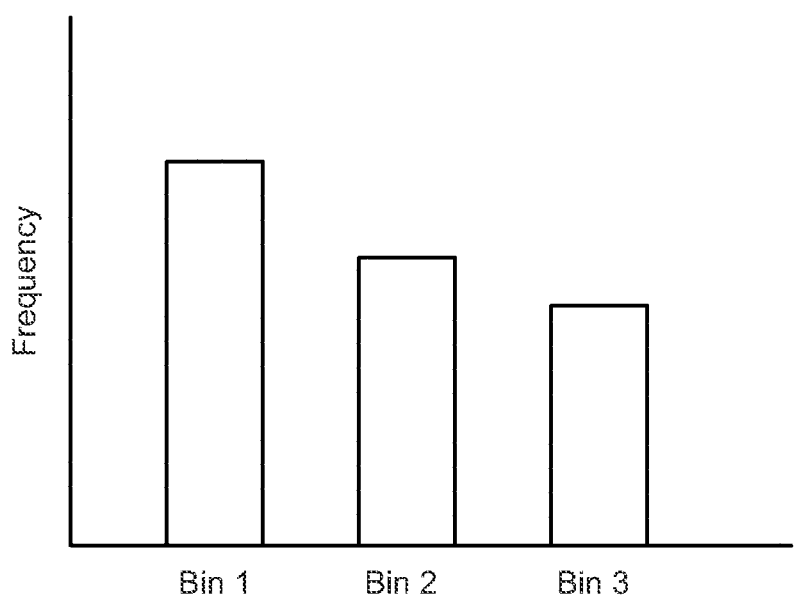
FIG. 4 is a histogram illustrating one example of separation of defects into bins based on results of stacking inspection data as shown in FIG. 2.

In this manner, defects that have substantially the same position within the multiple blocks can be identified and binned into one group. For example, as shown in FIG. 3, results of stacking the inspection data (e.g., a stacked cell) may include different bins (e.g., Bin 1, Bin 2, Bin 3, and Bin 4). Each of the bins corresponds to defects detected at different positions within the multiple blocks 18, and each of the bins may include multiple defects detected at substantially the same position within the multiple blocks. In this manner, each of the bins includes only defects detected at substantially the same position within the multiple blocks. In addition, results of stacking of the inspection data that may be generated by the method embodiments described herein may include a histogram or pareto chart, as shown in FIG. 4. As shown in FIG. 4, the histogram may illustrate the different bins (e.g., Bin 1, Bin 2, and Bin 3) into which the defects were grouped as well as the frequency with which defects were grouped into each bin. As such, the histogram illustrates the frequency with which defects were detected at substantially the same position in multiple blocks having the same type. Defects that are detected at substantially the same position at relatively high frequencies are most likely systematic defects, while defects that are detected at substantially the same position at relatively low frequencies are most likely random detects. As such, as a result of stacking the inspection data for multiple blocks having the same type, the defects will effectively be separated into systematic defect bins and random defect bins, in this manner, defects that are most likely systematic defects can be identified.

In one such embodiment, the method also includes sampling the defects from the bins for defect review. For example, by stacking the memory block, random defects can be separated from systematic defects and then the defects can be sampled from the bins for defect review scanning electron microscopy (SEM) review) when the inspection is completed. In one such example, defects from the systematic defect bins may be sampled more heavily for defect review since these defects may be of most interest to the memory device manufacturer. In another example, defects can be sampled from the systematic defect bins as well as the random defect bins such that both systematic defects and random defects are reviewed. In this manner, the embodiments described herein can improve the sampling strategy (including integrated defect organizer (iDO) sampling) used for defect review, thereby providing significant value to memory device manufacturers, iDO is further described in the above-referenced patent application by Kulkarni et al.

Figure 5:
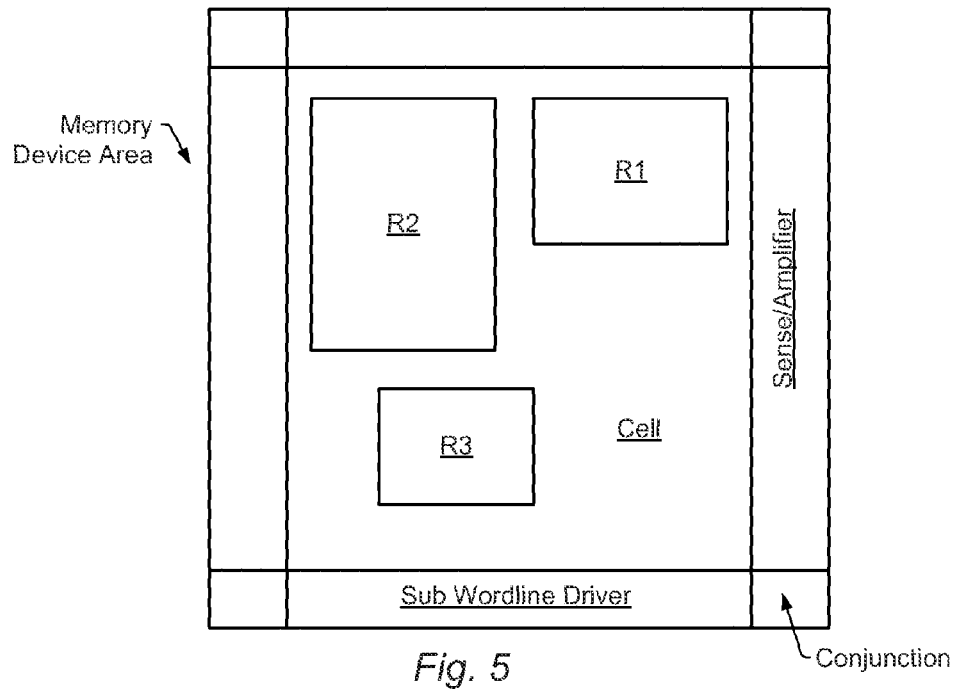
FIGS. 5-6 are schematic diagrams illustrating examples of dividing one or more blocks in a memory device area into multiple regions within the one or more blocks to separate different types of defects into different bins based on the multiple regions in which the positions of the defects are located.

In another embodiment, classifying the defects includes dividing one of the blocks into multiple regions within the block to separate different types of defects into different bins based on the multiple regions in which the positions of the defects are located. In this manner, classifying the defects may include binning by region. For example, a memory cell block can be divided into 2, 3, 4, or any number of regions to separate systematic defects or clusters (neighborhood defects) from random defects. In one such example, as shown in FIG. 5, the cell block of the memory device area may be divided into three regions (R1, R2, and R3). Some or all of the different types of blocks in the memory device area may be divided into any number of regions having any configuration that may or may not cover the entire area of the different types of blocks. Dividing one of the blocks into multiple regions within the block may be a sub-step of stacking inspection data as described above due to the stage accuracy limit of the inspection system. A boundary area may be set around a location to group defects into one bin. In this manner, defects that are located in the same region within a block in the memory device area can be grouped into the same bin. Results of such binning may include a histogram such as that shown in FIG. 4, except that unlike the histogram that may be generated by stacking inspection data, a histogram that is generated for results of binning by region may include different bins that correspond to different regions (e.g., Bin 1 may correspond to R1, Bin 2 may correspond to R2, etc.).

Figure 6:
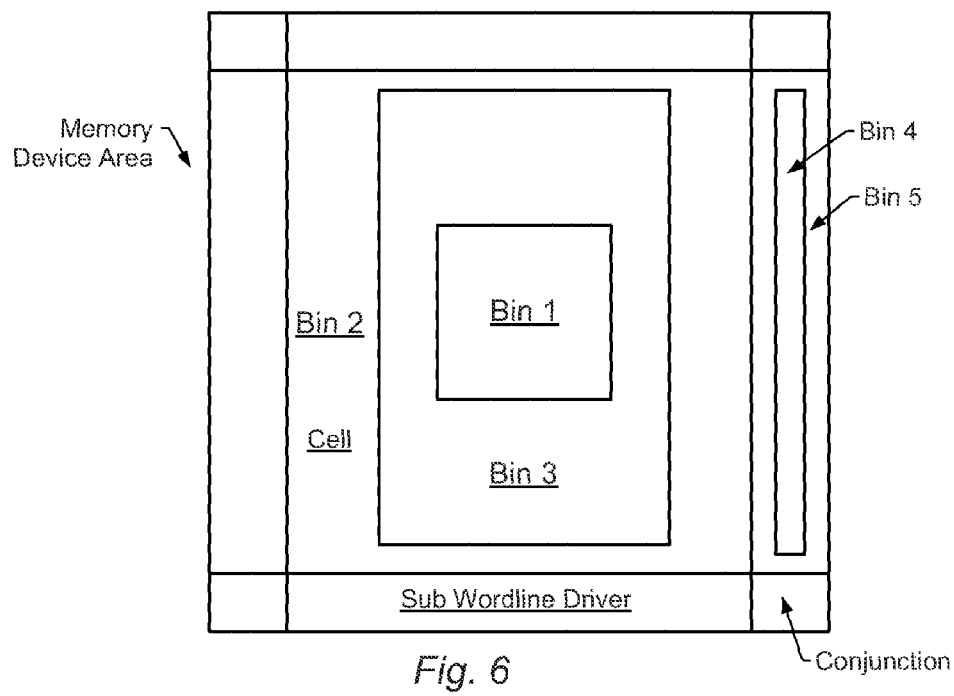

In another example of the above-described embodiment, different types of blocks within the memory device area (e.g., the cell block and the S/A block) can be divided into regions to separate defects by region. For example, as shown in FIG. 6, the cell block can be divided into three regions, which correspond to Bin 1, Bin 2, and Bin 3, and the S/A block can be divided into two regions, which correspond to Bin 4 and Bin 5. As shown in FIG. 6, some of the regions are located in a central area of the different types of blocks while other regions are located proximate to edges of the different types of blocks and surrounding the central area. In particular, as shown in FIG. 6, the region corresponding to Bin 1 is located in the centermost area of the cell block, the region corresponding to Bin 3 is located in a central area of the cell block surrounding the region corresponding to Bin 1, while the region corresponding to Bin 2 is located proximate to the edges of the cell block surrounding the region corresponding to Bin 3. In addition, the region corresponding to Bin 4 is located in a central area of the S/A block, while the region corresponding to Bin 5 is located proximate to the edges of the S/A block and surrounding the region corresponding to Bin 4.

In this manner, defects that are located in a central area of the different types of blocks and defects that are located near edges of the different types of blocks can be separated into different bins. Therefore, some of the bins may be systematic defect bins while other bins may be random defect bins. For example, systematic defects such as polymer-induced bridges, shorts, small contacts, and lithography-related defects may tend to occur along the edge of the memory cell block or S/A cell block. In this manner, defects in bins corresponding to a region near the edges of one type of block may be identified as systematic defects at the edge and separated from random defects grouped into other bins. Results of such binning by region may include a histogram such as that described above, except that the number of bins shown in the histogram may correspond to the number of regions into which the different types of blocks are divided.

In one embodiment, classifying the defects includes identifying defects located in regions of the blocks that are prone to nuisance defects as nuisance defects and eliminating the defects identified as the nuisance defects from results of inspection of the wafer. In this manner, inspection system sensitivity can be increased by separating out nuisance on special areas such as edges of the memory block. Regions of the blocks that are prone to nuisance defects and special areas of the different types of blocks can be determined in any suitable manner. In addition, identifying defects located in regions of the blocks that are prone to nuisance defects as nuisance defects can be performed using region-based binning as described above (e.g., in which a region is defined as a region of a block that is prone to nuisance defects). The defects identified as nuisance defects can be eliminated from the inspection results in any suitable manner.

Figure 7:
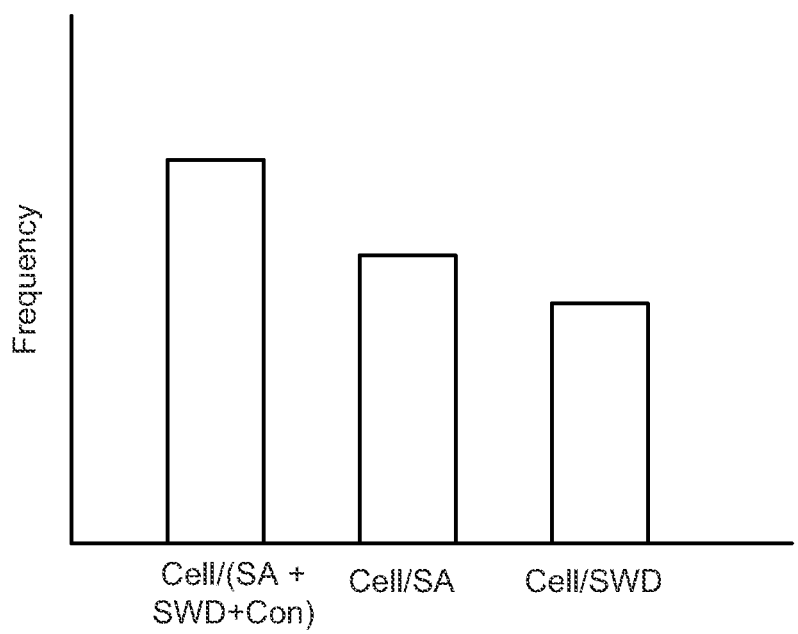
FIG. 7 is a histogram illustrating one example of results of determining a ratio of the numbers of defects detected in at least two different types of blocks in a memory device area and classifying the defects in the at least two different types of blocks based on the ratio.

In some embodiments, classifying the defects includes determining a ratio of the numbers of the defects detected in at least two of the different types of blocks and classifying the defects in the at least two of the different types of blocks based on the ratio. In this manner, classification may be performed by defect ratio. The defect ratios that may be determined for classification may include, for example, cell/(SA+SWD+conjunction), cell/SA, cell/SWD, etc. Results of such classification may include a histogram such as that shown in FIG. 7. For example, as shown in FIG. 7, the frequency with which defects are detected for each of the different ratios (cell/(SA+SWD+conjunction), cell/SA, and cell/SWD) are shown in the histogram. Since random defects may be located relatively evenly throughout all of the different types of blocks while the numbers of systematic defects detected in the different types of blocks may vary dramatically, the ratios of the numbers of defects detected in at least two of the different types of blocks may effectively normalize for random defects while indicating which type of block or block exhibited systematic defects. For example, a relatively high ratio of defects detected in one type of block compared to one or more other types of blocks may be used to classify the defects detected in that one type of block as potentially systematic defects. In contrast, a relatively low ratio of defects detected in one type of block compared to one or more other types of blocks may be used to classify the defects detected in that one type of block as probable random defects.

Figure 8:
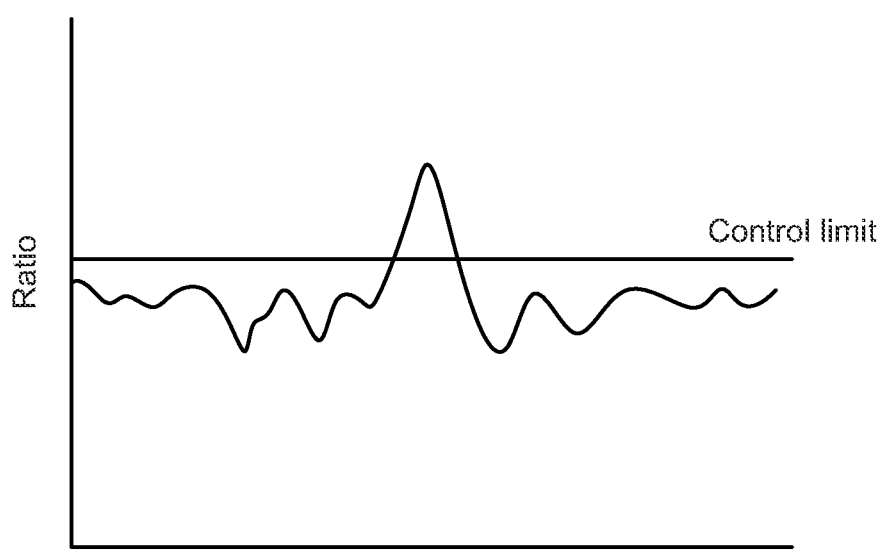
FIG. 8 is a plot illustrating one example of monitoring a ratio of the numbers of defects detected in at least two different types of blocks in a memory device area.

In one embodiment, the method includes monitoring a ratio of the numbers of the defects detected in at least two of the different types of blocks. For example, the method may include monitoring any of the ratios described above. If a ratio shows an abnormality, that abnormality will indicate that systematic defects occurred versus random defects, which can be located everywhere regardless of block. In one such example, since different types of blocks such as those described herein can be found in the inspection data, the ratio of cell block defects versus other block defects can be monitored and an abnormality in that ratio will indicate a systematic defect occurrence. In addition, one of the ratios described above such as cell/(SA+SWD+conjunction) can be plotted as shown in FIG. 8 as a function of time or wafer. A control limit for the ratio can also be shown in the plot, as shown in FIG. 8, such that a user can visually identify when the ratio goes above the control limit. A ratio above the control limit can indicate that a systematic defect causing mechanism is occurring, which could indicate to the user that there is a problem with the process and/or a process and design interaction issue. In this manner, the method may include monitoring region-based defect ratio, which could reduce the false excursion rate. For example, if the user cares about the defects in one type of block in the memory device area (e.g., a cell block), an excursion caused by a defect count increase in another type of block could be false. Therefore, by monitoring a defect ratio such as those described above (possibly at the same time as monitoring other things such as the total defect count), this false excursion rate could be reduced.

In a further embodiment, the method includes correlating the positions of the defects within the blocks with a bit map. The embodiments described herein provide better bit map correlation, which can speed up the learning cycle in the research and development stage. For example, the embodiments described herein provide improved coordinate accuracy for the determined positions of defects and specific information for defect coordinates thereby providing better hit map correlation to the inspection results. Improved bit map correlation will provide improved yield correlation, both of which provide significant value to memory device manufacturers. Correlating the positions of the defects within the blocks with a bit map may be performed in any suitable manner. Table 1 included below illustrates one example of results that may be produced by such correlating.

TABLE 1

| | Bit Map location | | Inspection location | |
|---|---|---|---|---|
| Block | | Coordinate in Block | Block | Coordinate in Block |
| Failure 1 | (R, C) | (X, Y) | (R, C) | (X, Y) |
| Failure 2 | (R, C) | (X, Y) | (R, C) | (X, Y) |
| ... | | | | |

In another embodiment, classifying the defects includes correlating the positions of the defects within the blocks with a bit map and determining types of the defects based on results of the correlating step. For example, defects in the memory cell block may become row, column, and single or double bit failure type defects in a bit map. In addition, defects in the S/A block may become block fail, speed fail, etc. type defects in a bit map. In this manner, the types of the defects detected on the memory device area can be determined based on the types of failures that the defects will cause.

In some embodiments, classifying the defects includes correlating the positions of the defects within the blocks with a bit map, determining types of the defects based on results of the correlating step, and eliminating one or more of the types of the defects from results of inspection of the wafer. For example, by correlating the positions of the defects with a bit map, false defects, trivial defects, optical noise, etc. can be eliminated from the inspection results. In one such example, if some bins include false defects at a certain location in a block due to color variation, those bins can be sorted out of the inspection results. In the same manner, bins corresponding to trivial defects, optical noise, etc, can be filtered from the inspection results. Eliminating such defects may increase the clarity of the inspection results. In this manner, by identifying false and trivial defects, the sensitivity of the inspection process can be maximized and the inspection sensitivities for each block type can be optimized, both of which provide significant value to memory device manufacturers.

In another embodiment, the method includes determining one or more problems with one or more processes used to form the memory device area on the wafer based on results of classifying the defects. For example, the parameters reported by the inspection system used to perform the method can be collected and monitored for statistical process control (SPC) applications. In addition, as described above, classifying the defects may include rapidly binning large defect quantities according to whether the defects fail on the edge or the interior of a block. Results of such binning can be used to identify specific process problems (e.g., lithography-related process problems), thereby providing value to memory device manufacturers. Furthermore, as described above, the defects may be classified based on the types of blocks in which the defects are located. In this manner, the defect classification results may indicate which types of blocks the defects are located in. That information as well as the positions of the different types of blocks within the memory device area can be used to identify defects that fall on blocks located at the edge of the die or reticle shot. That information can be used to identify lithographic problems of a lithography scanner and polymer-induced defects of dry etching systems thereby providing value to memory device manufacturers.

In a further embodiment, the method includes determining one or more parameters of one or more processes to be performed on the memory device area based on the positions of the defects. For example, the coordinates of the positions of the defects determined as described herein may be used to drive additional processes performed on the memory device area such as critical dimension scanning electron microscopy (CDSEM) review and failure analysis (FA) diagnosis.

In one embodiment, the method includes determining one or more parameters of one or more processes to be performed on the memory device area based on distribution of the defects on the memory device area and the positions of the defects. For example, the correct places for CD measurement can be selected using the defect distribution on the memory block of the inspection map and the x, y coordinates that are reported by the embodiments described herein.

In another embodiment, the method includes altering one or more parameters of a process used by the inspection system to generate the inspection data based on results of classifying the defects such that at least two of the different types of blocks in the memory device area are inspected with different sensitivities. In this manner, the inspection sensitivities can be optimized for each block type, which can provide significant value to memory device manufacturers. For example, since portions of the inspection data that correspond to different types of blocks can be identified using the methods described herein (by determining the positions of inspection data acquired for the memory device area in design or inspection data space), different sensitivities (e.g., different thresholds) can be used to detect defects in different types of blocks. Appropriate sensitivities for detecting defects in different types of blocks can be determined using results of the method embodiments described herein (e.g., by using defect classification results and inspection data corresponding to different types of defects, the inspection sensitivities for different types of blocks can be set such that certain types of defects are detected while other types of defects are not) or in any other manner.

In one embodiment, the method is performed by the inspection system during an inspection process performed by the inspection system for the wafer on which the memory device area is formed. In this manner, the method may be performed on-tool. As such, the embodiments described herein provide the benefit of an on-tool solution for classifying defects detected in a memory device area of a wafer. In addition, the embodiments described herein provide a complementary solution to DBB for memory customers, so the embodiments described herein can share the following on-tool benefits DBB. For example, the embodiments described herein provide anew technology to bin defects detected in a memory device area of a wafer better. Similar to iDO and integrated automatic defect classification (iADC), on-tool binning is more efficient than off-tool binning. With on-tool binning, users could discover and monitor systematic defects immediately after wafer inspection is completed. In addition, with improved coordinate accuracy from the extended platform (XP) package that is commercially available from KLA-Tencor, Milpitas, Calif. for BF inspection systems, which is a hardware update kit to improve coordinate accuracy, on-tool could output "near to perfect" design coordinate information for every defect. These coordinates could advantageously be used to drive CDSEM review and FA diagnosis. Furthermore, as soon as the inspection is finished, the results (e.g., one or more KLARF's) with all bin information can be output to a network for subsequent actions. In this manner, there will be no additional waiting time for results. Moreover, an algorithm configured to perform the methods described herein can be integrated into the iDO application on the fly on inspection systems (such as BF tools, for example, the 28xx tools that are commercially available from KLA-Tencor), and the combined outcome will be obtained when an inspection is finished.

Each of the embodiments of the method described above may include any other step(s) of any method(s) described herein. In addition, each of the embodiments of the method described above may be performed by any system embodiments described herein.

Any of the methods described herein may include storing results of one or more steps of one or more methods described herein in a storage medium. The results may include any of the results described herein. The results may be stored in any manner known in the art. In addition, the storage medium may include any storage medium described herein or any other suitable storage medium known in the art. After the results have been stored, the results can be accessed in the storage medium and used by any of the method or system embodiments described herein or any other method or system. Furthermore, the results may be stored "permanently," "semi-permanently," temporarily, or for some period of time. For example, the storage medium may be random access memory (RAM), and the results may not necessarily persist indefinitely in the storage medium. In addition, the results of any of the step(s) of any of the method(s) described herein can be stored using systems and methods such as those described in commonly owned U.S. patent application Ser. No. 12/234,201 by Bhaskar et al. filed Sep. 19, 2008, which published on Mar. 26, 2009 as U.S. Patent Application Publication No. 2009/0080759, and which is incorporated by reference as if fully set forth herein.

Figure 9:
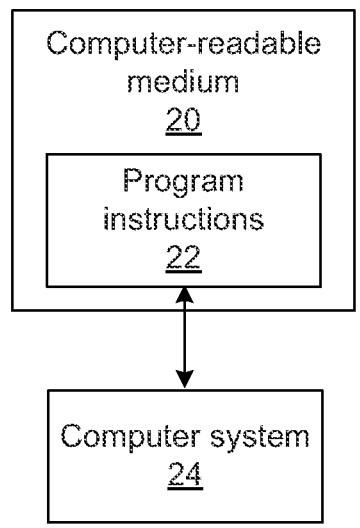
FIG. 9 is a block diagram illustrating one embodiment of a computer-readable medium storing program instructions executable on a computer system for performing a computer-implemented method for classifying defects detected in a memory device area on a wafer.

Another embodiment relates to a computer-readable medium storing program instructions executable on a computer system for performing a computer-implemented method for classifying defects detected in a memory device area on a wafer. One such embodiment is illustrated in FIG. 9. In particular, as shown in FIG. 9, computer-readable medium 20 includes program instructions 22 executable on computer system 24. The computer-implemented method for which the program instructions are executable is the computer-implemented method described above. For example, the computer-implemented method includes using the computer system to perform the following steps. The method includes determining positions of inspection data acquired for the memory device area by an inspection system. The memory device area includes different types of blocks. The inspection data includes data for defects detected in the memory device area. The method also includes determining positions of the defects with respect to a predetermined location within the blocks in which the defects are located based on the positions of the inspection data. In addition, the method includes classifying the defects based on the positions of the defects within the blocks. Each of the steps of the method described above may be performed as described further herein. The computer-implemented method may include any other step(s) of any other embodiment(s) described herein.

Program instructions 22 implementing methods such as those described herein may be stored on computer-readable medium 20. The computer-readable medium may be a storage medium such as a read-only memory, a random access memory, a magnetic or optical disk, or a magnetic tape. In addition, the computer-readable medium may include any other suitable computer-readable medium known in the art.

Computer system 24 may take various forms, including a personal computer system, mainframe computer system, workstation, image computer, parallel processor, or any other device known in the art. In general, the term "computer system" may be broadly defined to encompass any device having one or more processors, which executes instructions from a memory medium. The computer system may be included in an inspection system. The inspection system may be configured as described herein.

Figure 10:
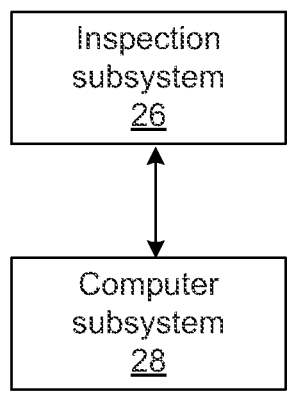
FIG. 10 is a block diagram illustrating one embodiment of a system configured to classify defects detected in a memory device area on a wafer.

An additional embodiment relates to a system configured to classify defects detected in a memory device area on a wafer. One embodiment of such a system is shown in FIG. 10. As shown in FIG. 10, the system includes inspection subsystem 26 configured to acquire inspection data for the memory device area formed on the wafer. Inspection subsystem 26 may include any suitable inspection subsystem such as those included in commercially available inspection systems the 28xx series tools, which are commercially available from KLA-Tencor). In addition, the inspection subsystem may be an inspection subsystem configured for BF inspection of a wafer and/or DF inspection of a wafer. The inspection subsystem may also be configured to acquire the inspection data by scanning light over the memory device area and detecting light reflected and/or scattered from the memory device area. Furthermore, the inspection subsystem may be configured for patterned wafer inspection. Moreover, an existing inspection system may be modified (e.g., a computer subsystem of the inspection system may be modified) such that the existing inspection system, including its inspection subsystem, can be configured and used as a system described herein. In addition, the inspection subsystem may be configured to perform any step(s) of any method(s) described herein. As described further above, the memory device area includes different types of blocks, and the inspection data includes data for defects detected in the memory device area.

As shown in FIG. 10, the system also includes computer subsystem 28. The computer subsystem is configured to determine positions of the inspection data. The computer subsystem is also configured to determine positions of the defects with respect to a predetermined location within the blocks in which the defects are located based on the positions of the inspection data. In addition, the computer subsystem is configured to classify the defects based on the positions of the defects within the blocks. The computer subsystem may be configured to determine the positions of the inspection data, to determine the positions of the defects, and to classify the defects as described further herein. Furthermore, the computer subsystem may be configured to perform any step(s) of any method(s) described herein. The computer subsystem may be further configured as described above with respect to computer system 24 shown in FIG. 9. The embodiment of the system described above may be further configured as described herein.

Further modifications and alternative embodiments of various aspects of the invention will be apparent to those skilled in the art in view of this description. For example, computer-implemented methods, computer-readable media, and systems for classifying defects detected in a memory device area of a wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing front the spirit and scope of the invention as described in the following claims.

What is claimed is:

1. A computer-implemented method for classifying defects detected in a memory device area on a wafer, comprising:

using a computer system to perform the following steps:
determining positions of inspection data acquired for the memory device area by an inspection system, wherein the memory device area comprises different types of blocks, and wherein the inspection data comprises data for defects detected in the memory device area;
determining positions of the defects with respect to a predetermined location within the blocks in which the defects are located based on the positions of the inspection data; and
classifying the defects based on the positions of the defects within the blocks, wherein said classifying comprises determining a ratio of the numbers of the defects detected in at least two of the different types of blocks and classifying the defects in the at least two of the different types of blocks based on the ratio.

2. The method of claim 1, wherein the predetermined location comprises a center or a corner of the blocks.

3. The method of claim 1, further comprising reporting x, y addresses of the different types of blocks within the memory device area and the positions of the defects within the blocks, wherein the positions of the defects within the blocks comprise x, y locations with respect to the predetermined location within the blocks.

4. The method of claim 1, wherein said classifying further comprises classifying the defects based on the positions of the defects within the blocks and the types of the blocks in which the defects are located.

5. The method of claim 1, wherein said classifying further comprises determining if the defects are systematic defects.

6. The method of claim 1, wherein said classifying further comprises stacking the inspection data for multiple blocks having the same type to separate the defects into systematic defect bins or random defect bins, and wherein the method further comprises sampling the defects from the bins for defect review.

7. The method of claim 1, wherein said classifying further comprises dividing one of the blocks into multiple regions within the block to separate different types of defects into different bins based on the multiple regions in which the positions of the defects are located.

8. The method of claim 1, wherein said classifying further comprises identifying defects located in regions of the blocks that are prone to nuisance defects as the nuisance detects and eliminating the detects identified as the nuisance defects from results of inspection of the wafer.

9. The method of claim 1, further comprising monitoring the ratio of the numbers of the defects detected in at least two of the different types of blocks.

10. The method of claim 1, further comprising correlating the positions of the defects within the blocks with a bit map.

11. The method of claim 1, wherein said classifying further comprises correlating the positions of the defects within the blocks with a bit map and determining types of the defects based on results of said correlating.

12. The method of claim 1, wherein said classifying further comprises correlating the positions of the defects within the blocks with a bit map, determining types of defects based on results of said correlating, and eliminating one or more of the types of the defects from results of inspection of the wafer.

13. The method of claim 1, further comprising determining one or more problems with one or more processes used to form the memory device area on the wafer based on results of said classifying.

14. The method of claim 1, further comprising determining one or more parameters of one or more processes to be performed on the memory device area based on the positions of the defects.

15. The method of claim 1, further comprising determining one or more parameters of one or more processes to be performed on the memory device area based on distribution of the defects on the memory device area and the positions of the defects.

16. The method of claim 1, further comprising altering one or more parameters of a process used by the inspection system to generate the inspection data based on results of said classifying such that at least two of the different types of blocks in the memory device area are inspected with different sensitivities.

17. The method of claim 1, wherein the method is performed by the inspection system during an inspection process performed by the inspection system for the wafer on which the memory device area is formed.

18. The method of claim 1, wherein determining the positions of the inspection data comprises determining the positions of the inspection data in design data space, and wherein determining the positions of the defects comprises determining the positions of the defects with respect to the predetermined location in the design data space.

19. The method of claim 1, wherein determining the positions of the inspection data comprises determining the positions of the inspection data in inspection data space, and wherein determining the positions of the defects comprises determining the positions of the defects with respect to the predetermined location in the inspection data space.

20. A non-transitory computer-readable medium storing program instructions executable on a computer system for performing a computer-implemented method for classifying defects detected in a memory device area on a wafer, wherein the computer-implemented method comprises:
using the computer system to perform the following steps:
determining positions of inspection data acquired for the memory device area by an inspection system, wherein the memory device area comprises different types of blocks, and wherein the inspection data comprises data for defects detected in the memory device area;
determining positions of the defects with respect to a predetermined location within the blocks in which the defects are located based on the positions of the inspection data; and
classifying the defects based on the positions of the defects within the blocks, wherein said classifying comprises determining a ratio of the numbers of the defects detected in at least two of the different types of blocks and classifying the defects in the at least two of the different types of blocks based on the ratio.

21. A system configured to classify defects detected in a memory device area on a wafer, comprising:
an inspection subsystem configured to acquire inspection data for the memory device area formed on the wafer, wherein the memory device area comprises different types of blocks, and wherein the inspection data comprises data for defects detected in the memory device area; and
a computer subsystem configured for:
determining positions of the inspection data;
determining positions of the defects with respect to a predetermined location within the blocks in which the defects are located based on the positions of the inspection data; and
classifying the defects based on the positions of the defects within the blocks, wherein said classifying comprises determining a ratio of the numbers of the defects detected in at least two of the different types of blocks and classifying the defects in the at least two of the different types of blocks based on the ratio.

22. The system of claim 21, wherein the predetermined location comprises a center or a corner of the blocks.

23. The system of claim 21, wherein the computer subsystem is further configured for reporting x, y addresses of the different types of blocks within the memory device area and the positions of the defects within the blocks, and wherein the positions of the defects within the blocks comprise x, y locations with respect to the predetermined location within the blocks.

24. The system of claim 21, wherein said classifying further comprises classifying the defects based on the positions of the defects within the blocks and the types of the blocks in which the defects are located.

25. The system of claim 21, wherein said classifying further comprises determining if the defects are systematic defects.

26. The system of claim 21, wherein said classifying further comprises stacking the inspection data for multiple blocks having the same type to separate the defects into systematic defect bins or random defect bins, and wherein the computer subsystem is further configured for sampling the defects from the bins for defect review.

27. The system of claim 21, wherein said classifying further comprises dividing one of the blocks into multiple regions within the block to separate different types of defects into different bins based on the multiple regions in which the positions of the defects are located.

28. The system of claim 21, wherein said classifying further comprises identifying defects located in regions of the blocks that are prone to nuisance defects as the nuisance defects and eliminating the defects identified as the nuisance defects from results of inspection of the wafer.

29. The system of claim 21, wherein the computer subsystem is further configured for monitoring the ratio of the numbers of the defects detected in at least two of the different types of blocks.

30. The system of claim 21, wherein the computer subsystem is further configured for correlating the positions of the defects within the blocks with a bit map.

31. The system of claim 21, wherein said classifying further comprises correlating the positions of the defects within the blocks with a bit map and determining types of the defects based on results of said correlating.

32. The system of claim 21, wherein said classifying further comprises correlating the positions of the defects within the blocks with a bit map, determining types of the defects based on results of said correlating, and eliminating one or more of the types of the defects from results of inspection of the wafer.

33. The system of claim 21, wherein the computer subsystem is further configured for determining one or more problems with one or more processes used to form the memory device area on the wafer based on results of said classifying.

34. The system of claim 21, wherein the computer subsystem is further configured for determining one or more parameters of one or more processes to be performed on the memory device area based on the positions of the defects.

35. The system of claim 21, wherein the computer subsystem is further configured for determining one or more parameters of one or more processes to be performed on the memory device area based on distribution of the defects on the memory device area and the positions of the defects.

36. The system of claim 21, wherein the computer subsystem is further configured for altering one or more parameters of a process used by the inspection subsystem to generate the inspection data based on results of said classi-

17 fying such that at least two of the different types of blocks in the memory device area are inspected with different sensitivities.

37. The system of claim 21, wherein the computer subsystem is further configured for performing determining the positions of the inspection data, determining the positions of the defects, and classifying the defects during an inspection process performed by the inspection subsystem for the wafer on which the memory device area is formed.

38. The system of claim 21, wherein determining the positions of the inspection data comprises determining the positions of the inspection data in design data space, and wherein determining the positions of the defects comprises determining the positions of the defects with respect to the predetermined location in the design data space.

39. The system of claim 21, wherein determining the positions of the inspection data comprises determining the positions of the inspection data in inspection data space, and wherein determining the positions of the defects comprises determining the positions of the defects with respect to the predetermined location in the inspection data space.

40. A computer-implemented method for classifying defects detected in a memory device area on a wafer, comprising:
using a computer system to perform the following steps:
determining positions of inspection data acquired for the memory device area by an inspection system, wherein the memory device area comprises different types of blocks, and wherein the inspection data comprises data for defects detected in the memory device area;
determining positions of the defects with respect to a predetermined location within the blocks in which the defects are located based on the positions of the inspection data;
classifying the defects based on the positions of the defects within the blocks; and
monitoring a ratio of the numbers of the defects detected in at least two of the different types of blocks.

41. A non-transitory computer-readable medium storing program instructions executable on a computer system for performing a computer-implemented method for classifying defects detected in a memory device area on a wafer, wherein the computer-implemented method comprises:
using the computer system to perform the following steps:
determining positions of inspection data acquired for the memory device area by an inspection system, wherein the memory device area comprises different types of blocks, and wherein the inspection data comprises data for defects detected in the memory device area;
determining positions of the defects with respect to a predetermined location within the blocks in which the defects are located based on the positions of the inspection data;
classifying the defects based on the positions of the defects within the blocks; and
monitoring a ratio of the numbers of the defects detected in at least two of the different types of blocks.

42. A system configured to classify defects detected in a memory device area on a wafer, comprising:
an inspection subsystem configured to acquire inspection data for the memory device area formed on the wafer, wherein the memory device area comprises different types of blocks, and wherein the inspection data comprises data for defects detected in the memory device area; and
a computer subsystem configured for:
determining positions of the inspection data;

18 determining positions of the defects with respect to a predetermined location within the blocks in which the defects are located based on the positions of the inspection data;
classifying the defects based on the positions of the defects within the blocks; and
monitoring a ratio of the numbers of the defects detected in at least two of the different types of blocks.

43. The system of claim 42, wherein the predetermine location comprises a center or a corner of the blocks.

44. The system of claim 42, wherein the computer subsystem is further configured for reporting x, y addresses of the different types of blocks within the memory device area and the positions of the defects within the blocks, and wherein the positions of the defects within the blocks comprise x, y locations with respect to the predetermined location within the blocks.

45. The system of claim 42, wherein said classifying comprises classifying the defects based on the positions of the defects within the blocks and the types of the blocks in which the defects are located.

46. The system of claim 42, wherein said classifying comprises determining if the defects are systematic defects.

47. The system of claim 42, wherein said classifying comprises stacking the inspection data for multiple blocks having the same type to separate the defects into systematic defect bins or random defect bins, and wherein the computer subsystem is further configured for sampling the defects from the bins for defect review.

48. The system of claim 42, wherein said classifying comprises dividing one of the blocks into multiple regions within the block to separate different types of defects into different bins based on the multiple regions in which the positions of the defects are located.

49. The system of claim 42, wherein said classifying comprises identifying defects located in regions of the blocks that are prone to nuisance defects as the nuisance defects and eliminating the defects identified as the nuisance defects from results of inspection of the wafer.

50. The system of claim 42, wherein said classifying comprises determining the ratio of the numbers of the defects detected in at least two of the different types of blocks and classifying the defects in the at least two of the different types of blocks based on the ratio.

51. The system of claim 42, wherein the computer subsystem is further configured for correlating the positions of the defects within the blocks with a bit map.

52. The system of claim 42, wherein said classifying comprises correlating the positions of the defects within the blocks with a bit map and determining types of the defects based on results of said correlating.

53. The system of claim 42, wherein said classifying comprises correlating the positions of the defects within the blocks with a bit map, determining types of the defects based on results of said correlating, and eliminating one or more of the types of the defects from results of inspection of the wafer.

54. The system of claim 42, wherein the computer subsystem is further configured for determining one or more problems with one or more processes used to form the memory device area on the wafer based on results of said classifying.

55. The system of claim 42, wherein the computer subsystem is further configured for determining one or more parameters of one or more processes to be performed on the memory device area based on the positions of the defects.

56. The system of claim 42, wherein the computer subsystem is further configured for determining one or more parameters of one or more processes to be performed on the memory device area based on distribution of the defects on the memory device area and the positions of the defects.

57. The system of claim 42, wherein the computer subsystem is further configured for altering one or more parameters of a process used by the inspection subsystem to generate the inspection data based on results of said classifying such that at least two of the different types of blocks in the memory device area are inspected with different sensitivities.

58. The system of claim 42, wherein the computer subsystem is further configured for performing determining the positions of the inspection data, determining the positions of the defects, classifying the defects, and monitoring the ratio during an inspection process performed by the inspection subsystem for the wafer on which the memory device area is formed.

59. The system of claim 42, wherein determining the positions of the inspection data comprises determining the positions of the inspection data in design data space, and wherein determining the positions of the defects comprises determining the positions of the defects with respect to the predetermined location in the design data space.

60. The system of claim 42, wherein determining the positions of the inspection data comprises determining the positions of the inspection data in inspection data space, and wherein determining the positions of the defects comprises determining the positions of the defects with respect to the predetermined location in the inspection data space.

* * * * *